(12) United States Patent
Iwai et al.

(10) Patent No.: US 7,314,797 B2
(45) Date of Patent: Jan. 1, 2008

(54) SEMICONDUCTOR DEVICE AND ITS MANUFACTURING METHOD

(75) Inventors: Moriya Iwai, Hyogo (JP); Masaaki Yoshida, Hyogo (JP); Hiroaki Nakanishi, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 293 days.

(21) Appl. No.: 11/206,124

(22) Filed: Aug. 18, 2005

(65) Prior Publication Data

US 2005/0275041 A1 Dec. 15, 2005

Related U.S. Application Data

(62) Division of application No. 10/479,629, filed on Dec. 4, 2003, now Pat. No. 6,949,790.

(30) Foreign Application Priority Data

Sep. 19, 2001 (JP) .............................. 2001-284764

(51) Int. Cl.
*H01L 21/336* (2006.01)

(52) U.S. Cl. ....................... 438/258; 438/266; 257/315; 257/E21.209; 257/E21.422; 257/E27.064

(58) Field of Classification Search ................ 438/257, 438/258, 266, 770; 257/315, E21.209, E21.422, 257/E27.064
See application file for complete search history.

(56) References Cited

U.S. PATENT DOCUMENTS

| | | |
|---|---|---|
| 5,614,748 A | 3/1997 | Nakajima et al. |
| 6,159,799 A | 12/2000 | Yu |
| 6,362,050 B2 | 3/2002 | Kalnitsky et al. |
| 6,482,692 B2 * | 11/2002 | Kawasaki et al. .......... 438/218 |

FOREIGN PATENT DOCUMENTS

| | | |
|---|---|---|
| JP | 58-121679 | 7/1983 |
| JP | 60-167376 | 8/1985 |
| JP | 62-45073 | 2/1987 |
| JP | 06-45614 | 2/1994 |
| JP | 06-085275 | 3/1994 |
| JP | 8-46067 | 2/1996 |
| JP | 8-293564 | 11/1996 |
| JP | 10-116923 | 5/1998 |
| JP | 2000-150683 | 5/2000 |
| WO | WO 94/00881 | 1/1994 |

* cited by examiner

*Primary Examiner*—Quoc Hoang
(74) *Attorney, Agent, or Firm*—Dickstein Shapiro LLP

(57) ABSTRACT

A semiconductor device is capable of being applied with both a positive and a negative voltage to its control gate, and writing to its memory requires a low voltage. A control gate is formed on a memory unit region of a field oxide film, and an inter-layer silicon oxide film is formed on its surface. A gate oxide film for a non-volatile memory is formed on a P substrate between N type diffusion layers. The floating gate is formed on the inter-layer silicon oxide film, the field oxide film, and the gate oxide film for the non-volatile memory. Since a large coupling ratio between the control gate and the floating gate is available on the field oxide film, memory rewriting requires only a low voltage. Further, since the control gate is formed by a poly silicon film, both a positive voltage and a negative voltage can be applied to the control gate.

3 Claims, 31 Drawing Sheets

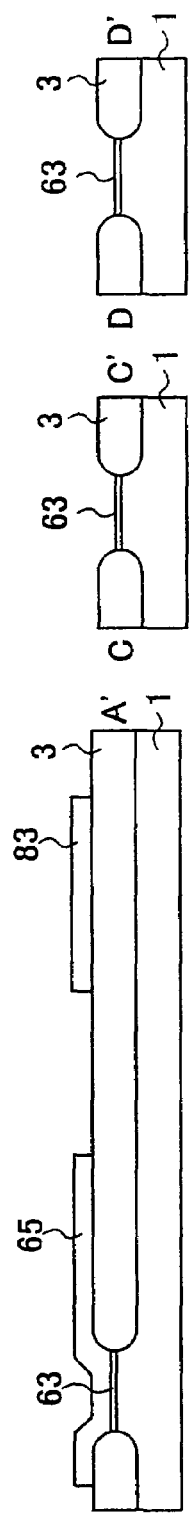
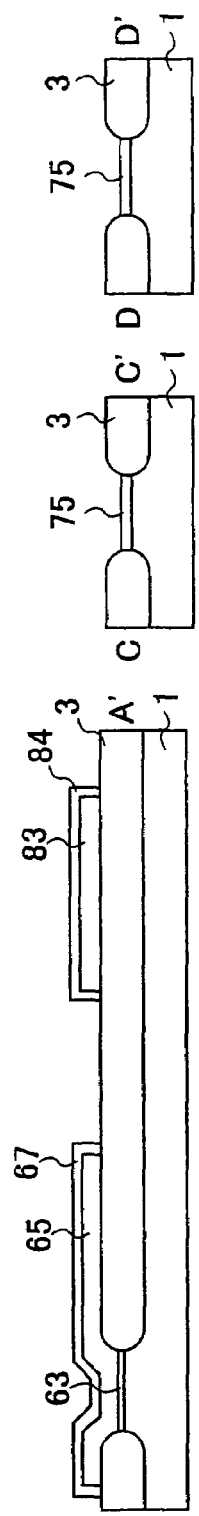
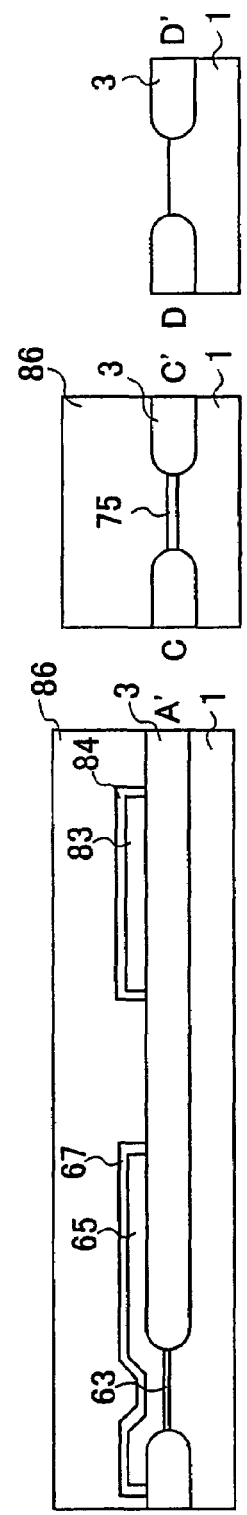
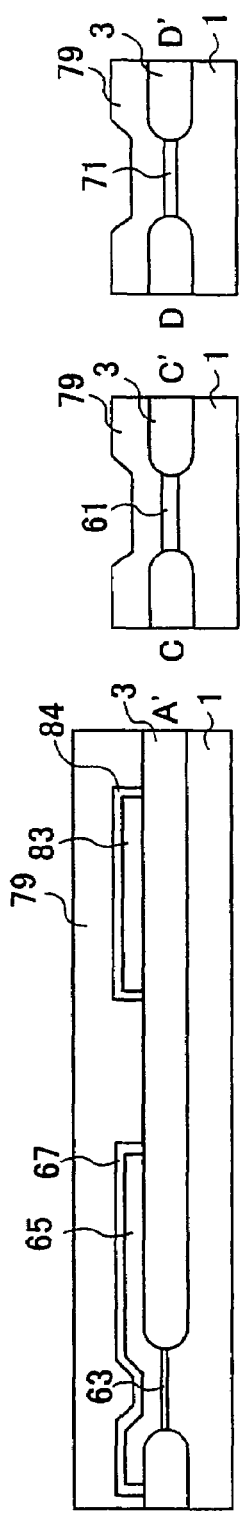

of gates. Namely, they are a one-layer gate type and a
SEMICONDUCTOR DEVICE AND ITS MANUFACTURING METHOD

CROSS REFERENCE TO RELATED APPLICATIONS

The present application is a divisional of U.S. application Ser. No. 10/479,629, filed Dec. 4, 2003 now U.S. Pat. No. 6,949,790, the disclosure of which is herewith incorporated by reference in its entirety.

TECHNICAL FIELD

The present invention generally relates to a semiconductor device and a manufacturing method thereof, and especially relates to a semiconductor device equipped with a non-volatile memory, and manufacturing method thereof.

In this specification, a first electric conduction type is a P type or an N type, and a second electric conduction type is an N type or a P type, an electric conduction type reverse to the first electric conduction type, respectively.

BACKGROUND ART

As kinds of a non-volatile memory called EEPROM (electrically erasable programmable random memory), there are generally two kinds that are differentiated by quantities two-layer gate type. As for the one-layer gate type, technology has been available, such as presented by Japan Provisional Publications No. 6-85275 and No. 8-506693. As for the two-layer gate type, technology has been available, such as presented by Japanese Patent Publication No. 4-80544.

A plan view of a one-layer gate type non-volatile memory is shown in FIG. 28, as a conventional example.

On a P type semiconductor substrate (P substrate) 101, N type diffusion layers 103,105,107 and a control gate 109 consisting of an N type diffusion layer are formed. The N type diffusion layers 103 and 105 are formed with an interval, and the N type diffusion layers 105 and 107 are formed with an interval.

On the P substrate 101 that contains the interval between the N type diffusion layers 103 and 105, a selection gate 111 consisting of a poly silicon film is formed through a gate oxide film (illustration is omitted), partly overlapping with the N type diffusion layers 103 and 105.

A floating gate 113 consisting of a poly silicon film is formed through a silicon oxide film (illustration is omitted) contiguously on the P substrate 101 that includes the interval between the N type diffusion layers 105 and 107, and the control gate 109. Near the interval between the N type diffusion layers 105 and 107, the floating gate 113 is arranged such that it overlaps with the N type diffusion layers 105 and 107 in part through a gate oxide film for the memory.

When erasing the one-layer gate type non-volatile memory, i.e., injecting an electron to the floating gate 113, the N type diffusion layer 107 is set at 0V (volt), and the N type diffusion layer 103 is set at a predetermined potential Vpp, and the predetermined potential Vpp is applied to the control gate 109 and the selection gate 111. In this manner, a transistor is constituted by the N type diffusion layers 103 and 105, and the selection gate 111 is turned on, and the electron is injected into the floating gate 113 through the gate oxide film for the memory from the N type diffusion layer 105.

When writing to the one-layer gate type non-volatile memory, i.e., discharging an electron from the floating gate 113, the control gate 109 is set at 0V, and the N type diffusion layer 107 is opened, and the predetermined potential Vpp is applied to the N type diffusion layer 103 and the selection gate 111. In this manner, the transistor constituted by the N type diffusion layers 103 and 105, and the selection gate 111 is turned on, and the electron injected into the floating gate 113 is drawn out by the N type diffusion layer 103 through the gate oxide film for the memory by the tunnel effect.

In the one-layer gate type non-volatile memory, the control gate 109 formed by the diffusion layer, and the floating gate 113 consisting of the poly silicon film can be overlapped with each other on a large area of the substrate, providing a large coupling ratio.

A sectional view of a two-layer gate type non-volatile memory is shown in FIG. 29, as a conventional example. An N type diffusion layer 117 and an N type diffusion layer 119 are formed on the P substrate 101 with an interval. On the P substrate 101, and between the N type diffusion layers 117 and 119, a floating gate 123, which consists of a poly silicon film, is formed through a gate oxide film 121 for the memory, overlapping in part with the N type diffusion layers 117 and 119. On the floating gate 123, a control gate 127, which consists of a poly silicon film, is formed through a silicon oxide film 125.

When erasing the two-layer gate type non-volatile memory, i.e., injecting an electron to the floating gate 123, the N type diffusion layer 117 is set at 0V, and N type diffusion layer 119 is set at a predetermined potential Vpp, and the predetermined potential Vpp is applied to the control gate 127, thereby, an electron is injected into the floating gate 123 through the gate oxide film 121 for the memory from the N type diffusion layer 119.

When writing to the two-layer gate type non-volatile memory, i.e., discharging an electron from the floating gate 123, the control gate 127 is set at 0V, and the N type diffusion layer 117 is opened, and the predetermined potential Vpp is applied to the N type diffusion layer 119, thereby, the electron injected into the floating gate 123 is drawn out by the N type diffusion layer 119 through the gate oxide film 121 for the memory by the tunnel effect.

In the one-layer gate type non-volatile memory, since the large coupling ratio is available, memory rewriting requires comparatively low voltage. However, since the N type diffusion layer constitutes the control gate 109, there is a problem that a negative voltage cannot be applied to the control gate 109.

In the two-layer gate type non-volatile memory, while a negative voltage can be applied to the control gate 127, due to the control gate 127 being constituted by the poly silicon film, a comparatively large voltage is required in writing, since the coupling ratio is relatively small, as compared with the one-layer gate type non-volatile memory.

Further, when a non-volatile memory is used, a high-voltage transistor is often prepared additionally in order to rewrite to the memory. In order to prevent destruction of the gate oxide film, due to a high voltage applied, the gate oxide film of the high-voltage transistor is formed thicker than the gate oxide film of the memory, which constitutes the memory unit. An example of a method is explained with reference to FIG. 30.

FIG. 30 is a sectional view showing a process that forms the gate oxide films with two values of film thickness.

(1) A unit separation insulation film 129 and a silicon oxide film 131 are formed on the P substrate 101 surface (refer to sub-section (a)).

(2) A resist pattern 133 is prepared with the ordinary phototype process technology, which covers a high-voltage transistor region, and is open at a low voltage transistor region, and then a silicon oxide film 131 of the low voltage transistor region is selectively removed, using the resist pattern 133 as the mask (refer to sub-section (b)).

(3) After removing the resist pattern 133, a low voltage endurance gate oxide film 135 for the low voltage transistor is formed in the low voltage transistor region on the surface of the P substrate 101 by a heat oxidization process, and simultaneously, the silicon oxide film 131 of the high-voltage transistor region is grown up such that a high voltage endurance gate oxide film 137 is formed for the high-voltage transistor, the film being thicker than the low voltage endurance gate oxide film 135 (refer to sub-section (c)). In this manner, two kinds of gate oxide films with different film thickness values are formed.

(4) A poly silicon film is formed all over the P substrate 101, patterning is performed on the poly silicon film such that a gate electrode 139 is formed on the low voltage endurance gate oxide film 135, and a gate electrode 141 is formed on the high voltage endurance gate oxide film 137 (refer to sub-section (d)).

In the above manufacturing method, the high voltage endurance gate oxide film 137 is formed by applying the heat oxidization process twice (hereinafter, called the twice-oxidized film), and the low voltage gate oxide film 135 is formed by the oxide film formed by applying the heat oxidization process once (hereinafter, called once-oxidized film). The twice-oxidized film tends to have less uniformity in film thickness, and lower reliability than the once-oxidized film.

A so-called tunnel oxide film for writing is often formed additionally, which has a film thickness different from the gate oxide films that are used in the low voltage transistor and the high-voltage transistor. In this case, a total of three types of silicon oxide films, having different film thickness, are formed. Usually, the thickest film is formed by applying the heat oxidization process 3 times (called a 3 times-oxidized film, hereinafter) through the manufacturing method described above. By this method, thickness of the 3 times-oxidized film becomes even less uniform than the twice-oxidized film, making it difficult to control total film thickness, and causing reliability to deteriorate.

Since the tunnel oxide film of which reliability is required to be the highest becomes a twice-oxidized film in an advanced miniature process where tunnel oxide film thickness is thicker than gate oxide film thickness of a low voltage transistor, it is feared that reliability may fall, which results from a resist pattern being formed on a silicon oxide film that constitutes a part of the twice-oxidized film in the formation process of the twice-oxidized film.

Further, when the tunnel oxide film thickness and the gate oxide film thickness of the low voltage transistor are close, film thickness control is a highly difficult matter in view of the presence of a natural oxide film that grows up on the semiconductor substrate surface, and controllability of the oxidization furnace used in a heat oxidization process, etc.

DISCLOSURE OF INVENTION

A first object of the present invention is offering a semiconductor device equipped with a non-volatile memory, which can perform memory rewriting at a low voltage, and accept both a positive voltage and a negative voltage to its control gate.

A second object of the present invention is offering a manufacturing method that can reduce film thickness variation of both a gate oxide film for the memory, and a gate oxide film for transistors, such that the reliability is improved, when forming a non-volatile memory and other transistors simultaneously.

The semiconductor device of the present invention includes a first insulation film that is formed on a first electric conduction type semiconductor substrate, two diffusion regions of a second electric conduction type formed separately at an interval on the surface of a region contiguous to the first insulation film on the semiconductor substrate, a gate oxide film formed by overlapping in part with the two diffusion regions on the semiconductor substrate that include the interval between the two diffusion regions, a control gate of a poly silicon film formed on the first insulation film, and a poly silicon film formed on the first insulation film and the gate oxide film, wherein a non-volatile memory is prepared on the first insulation film, which is constituted by a floating gate arranged by overlapping with an upper layer or a lower layer of the control gate through a second insulation film.

The non-volatile memory of the semiconductor device of the present invention is a two-layer gate type wherein the control gate and the floating gate are laminated on the first insulation film such that a large coupling ratio is obtained and a lower voltage can be used for rewriting than for a conventional two-layer gate type non-volatile memory. Further, since the control gate is formed on the first insulation film, being electrically separated from the semiconductor substrate, both positive and negative voltages can be applied to the control gate, which is impossible in a conventional one-layer gate type non-volatile memory.

A first manufacturing method of the semiconductor device of the present invention is a manufacturing method of a semiconductor device equipped with a non-volatile memory and a transistor, including steps (A) through (E) as follows.

(A) A step that is configured to form a field oxide film on a semiconductor substrate surface, which separates units, and to form an active region surrounded by the field oxide film, and to form a gate oxide film for a transistor on the surface of the active region.

(B) A step that is configured to form a poly silicon film all over the upper surface of the semiconductor substrate, and to form a control gate on a memory unit region of the field oxide film, and a gate electrode for the transistor on the gate oxide film for the transistor by patterning the poly silicon film.

(C) A step that is configured to form an inter-layer silicon oxide film on the surface of the control gate and the surface of the gate electrode for the transistor by applying a heat oxidization process.

(D) A step that is configured to form a gate oxide film for the memory on the surface of the active region of the memory unit region by a heat oxidization process after selectively removing the silicon oxide film from the active region surface of the memory unit region.

(E) A step that is configured to form a poly silicon film all over the upper surface of the semiconductor substrate, and to form a floating gate on the inter-layer silicon oxide film, the field oxide film, and the gate oxide film for the memory by patterning the silicon oxide film.

According to the first manufacturing method, the semiconductor device of the present invention can be manufactured. Further, both the gate oxide film for the transistor and the gate oxide film for the memory can be formed by the once-oxidized film, enhancing the reliability of the both gate oxide films, and reducing film thickness variation.

A second manufacturing method of the semiconductor device of the present invention is a manufacturing method of a semiconductor device equipped with a non-volatile memory, a high-voltage transistor, and a low voltage transistor, and includes steps (A) through (E) as follows.

(A) A step that is configured to form a field oxide film that separates units on a semiconductor substrate surface, and an active region surrounded by the field oxide film, and to form a gate oxide film for the memory on the active region surface.

(B) A step that is configured to form a poly silicon film all over the upper surface of the semiconductor substrate, and to form a floating gate on the gate oxide film for the memory in the memory unit region and the field oxide film by patterning the poly silicon film.

(C) A step that is configured to form an inter-layer silicon oxide film on the surface of the floating gate by a heat oxidization process, and to form a high voltage endurance gate oxide film for the high voltage transistor by growing the thickness of the gate oxide film for the memory on the surface of the active region of the high voltage transistor region.

(D) A step that is configured to form a low voltage endurance gate oxide film for the low voltage transistor on the surface of the active region of the low voltage transistor region, and to grow the thickness of the low voltage endurance gate oxide film by a heat oxidization process after selectively removing the silicon oxide film from the surface of the active region of the low voltage transistor region.

(E) A step that is configured to form a poly silicon film all over the upper surface of the semiconductor substrate, and to form a control gate at least on an upper layer of the floating gate that is present on the field oxide film of the memory unit region through the inter-layer silicon oxide film, a gate electrode for the low voltage transistor on the low voltage endurance gate oxide film, and a gate electrode for the high voltage transistor on the high voltage endurance gate oxide film by patterning the poly silicon film.

According to the second manufacturing method, the semiconductor device of the present invention can be manufactured. Further, both the low voltage endurance gate oxide film for the low voltage transistor and the gate oxide film for the memory are formed by the once-oxidized film, enhancing the reliability of the both gate oxide films, and reducing film thickness variation.

Further, since the gate electrode for the low voltage transistor and the gate electrode for the high-voltage transistor are formed separately from the floating gate, silicide processing by tungsten silicide etc. of the gate electrode for the low voltage transistor and the gate electrode for the high-voltage transistor is facilitated.

A manufacturing method of the semiconductor device of the present invention is a manufacturing method of a semiconductor device equipped with a non-volatile memory, a high-voltage transistor, and a low voltage transistor, and includes steps (A) through (F) as follows.

(A) A step that is configured to form a field oxide film that separates units on a semiconductor substrate, and an active region surrounded by the field oxide film, and to form a silicon oxide film for a gate oxide film on the active region surface.

(B) A step that is configured to form a gate oxide film for the non-volatile memory on the surface of the active region of the memory unit region by a heat oxidization process, and to form a high voltage endurance gate oxide film for the high voltage transistor by growing the thickness of the silicon oxide film for the gate oxide film of the high voltage transistor region, after selectively removing at least the oxide film for the gate oxide film on the surface of the active region of the memory unit region.

(C) A step that is configured to form a poly silicon film all over the upper surface of the semiconductor substrate, and to form a floating gate on the gate oxide film for the memory in the memory unit region and the field oxide film, and a gate electrode for the high voltage transistor on the high voltage endurance gate oxide film by patterning the poly silicon film.

(D) A step that is configured to form an inter-layer silicon oxide film on the surface of the floating gate and on the surface of the gate electrode for the high voltage transistor by a heat oxidization process.

(E) A step that is configured to form a low voltage endurance gate oxide film for the low voltage transistor on the surface of the active region of the low voltage transistor region by a heat oxidization process after selectively removing the silicon oxide film on the surface of the active region of the low voltage transistor region.

(F) A step that is configured to form a poly silicon film all over the upper surface of the semiconductor substrate, to form a control gate on at least the upper layer of the floating gate that is present on the field oxide film of the memory unit region through the inter-layer silicon oxide film, and to form a gate electrode for the low voltage transistor on the low withstand gate oxide film.

According to the manufacturing method, the semiconductor device of the present invention can be manufactured. Further, both the low voltage endurance gate oxide film for the low voltage transistor and the gate oxide film for the memory are formed with the once-oxidized film, enhancing the reliability of both gate oxide films, and reducing film thickness variation. Further, the high voltage endurance gate oxide film for the high-voltage transistor is formed with the twice-oxidized film, enhancing the reliability of the high voltage endurance gate oxide film, and reducing film thickness variation, compared with the conventional technology.

BRIEF DESCRIPTION OF DRAWINGS

FIG. 21 shows sectional views for explaining the eighth embodiment of the manufacturing method, which are in the A-A' cross-section and the C-C' cross-section of the sub-section (A) of FIG. 20, and in the D-D' cross-section of the sub-section (E) of FIG. 20.

BEST MODE FOR CARRYING OUT THE INVENTION

Figure 1A:
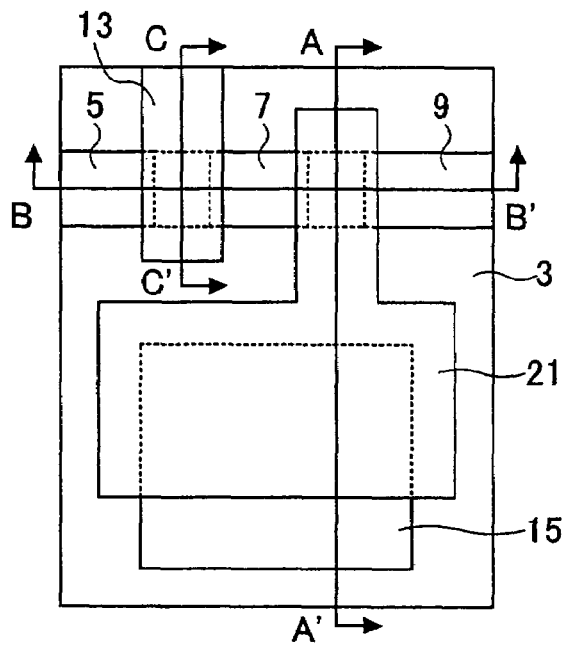
FIG. 1 shows a first embodiment of the semiconductor device. A plan view is shown at sub-section (A), a sectional view in the A-A' cross-section of the sub-section (A) is shown at sub-section (B), a sectional view in the B-B' cross-section of the sub-section (A) is shown at sub-section (C), and a sectional view in the C-C' cross-section of the sub-section (A) is shown at sub-section (D).
Figure 1B:
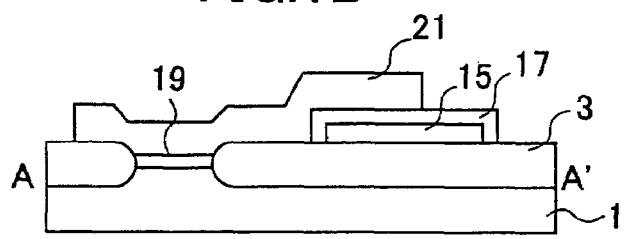
Figure 1C:
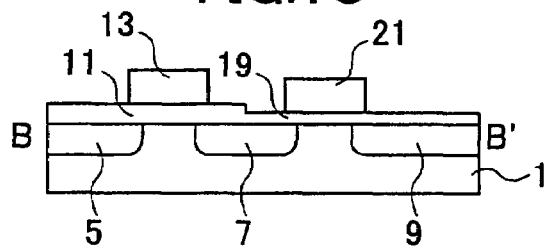
Figure 1D:
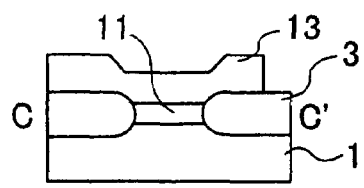

Embodiments of the present invention are explained with reference to attached figures.

As for the semiconductor device of the present invention, the second insulation film between the control gate and the floating gate is desired to be structured by laminating a silicon oxide film-a silicon nitride film-a silicon oxide film.

Consequently, since the laminating film containing the silicon nitride film, through which an electron cannot pass easily, is prepared between the control gate and the floating gate, reliability of the memory is enhanced.

The semiconductor device of the present invention may include a tunnel oxide film the thickness of which is thinner than the gate oxide film for the memory, which is formed on one of the two diffusion regions, and a part of the floating gate may be formed also on the tunnel oxide film. Thereby, a coupling ratio can be raised, enhancing design flexibility of the memory properties.

FIG. 1 shows the first embodiment of the semiconductor device. A plan view is shown at sub-section (A), a sectional view in the A-A' cross-section of the sub-section (A) is shown at sub-section (B), a sectional view in the B-B' cross-section of the sub-section (A) is shown at sub-section (C), and a sectional view in the C-C' cross-section of the sub-section (A) is shown at sub-section (D). Although this embodiment describes only one memory unit, the embodiment is applicable to any number of memory units. This embodiment is explained with reference to FIG. 1.

A field oxide film 3 (first insulation film) for unit separation is formed on the surface of a P substrate 1 in thickness, for example, between 4500A and 7000A. Here, in this embodiment, the film is formed 5000A thick. N type diffusion layers 5, 7, and 9 are formed in an active region of the P substrate 1 surrounded by the field oxide film 3. The N type diffusion layers 5 and 7 are formed with an interval, and the N type diffusion layers 7 and 9 are formed with an interval.

A high voltage endurance gate oxide film 11 for a high-voltage transistor is formed on the surface of the P substrate 1 that includes the interval region between the N type diffusion layers 5 and 7, partly overlapping with the N type diffusion layers 5 and 7, in film thickness, for example, between 400A and 600A. Here, in this embodiment, it is formed 500A thick. On the high voltage endurance gate oxide film 11, a selection gate 13 is formed by a poly silicon film in thickness, for example, between 2500A and 4500A. Here, in this embodiment, it is formed 3500A thick. The N type diffusion layers 5 and 7, the high voltage endurance gate oxide film 11, and the selection gate 13 constitute the high-voltage transistor.

On the memory unit region of the field oxide film 3, a control gate 15 of a poly silicon film is formed in film thickness, e.g., between 2500A and 4500A. Here, in this embodiment, it is formed 3500A thick. On the surface of the control gate 15, an inter-layer silicon oxide film 17 (second insulation film) (illustration is omitted in sub-section (A) of FIG. 1) is formed in thickness, e.g., between 150A and 250A. Here, in this embodiment, it is formed 200A thick.

A gate oxide film 19 for the memory is formed on the surface of the P substrate 1 that includes the interval region between the N type diffusion layers 7 and 9, partly overlapping with the N type diffusion layers 7 and 9 in thickness, e.g., between 80A and 110A. Here, in this embodiment, it is formed 100A thick. The gate oxide film 19 for the memory also serves as a tunnel oxide film. A floating gate 21 of a poly silicon film thickness of which ranges, e.g., between 2500A and 4500A, is formed on the inter-layer silicon oxide film 17, the field oxide film 3, and the gate oxide film 19 for the memory. Here, in this embodiment, it is formed 3500A thick.

In the memory unit of the first embodiment of the semiconductor device, the control gate 15 of the poly silicon film on the field oxide film 3, and the floating gate 21 are widely overlapped with each other through the inter-layer silicon oxide film 17, providing a large coupling ratio, thereby memory rewriting can be performed at a low voltage. Further, since the control gate 15 is formed by the poly silicon film, both positive and negative voltages can be applied to the control gate 15.

Figure 2:
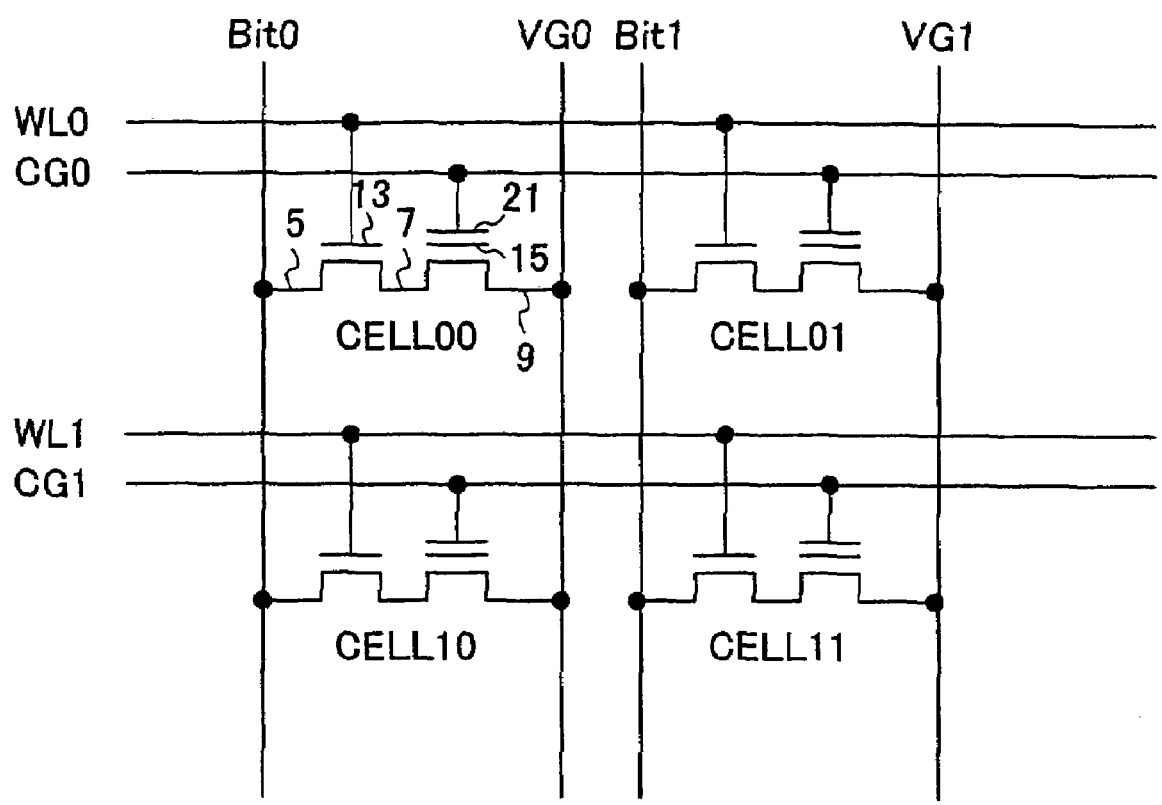
FIG. 2 is a circuit diagram, showing an example when memory units of this embodiment are arranged in a matrix.
Figure 3A:
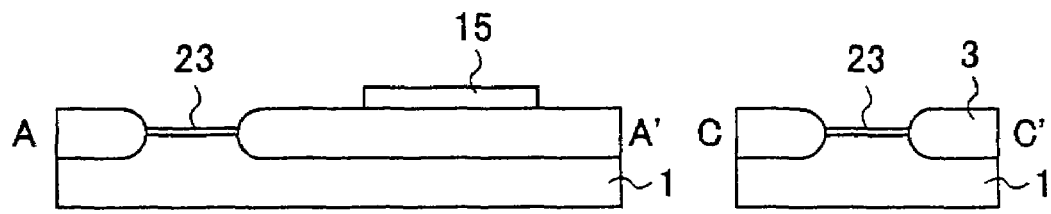
FIG. 3 shows steps of a first embodiment of the manufacturing method by sectional views, showing in the A-A' cross-section and in the C-C' cross-section of the sub-section (A) of FIG. 1.
Figure 3B:
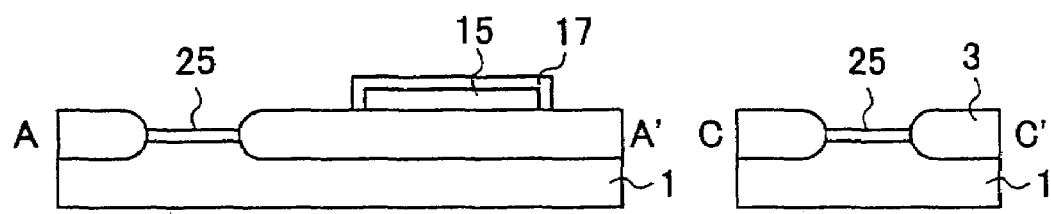
Figure 3C:
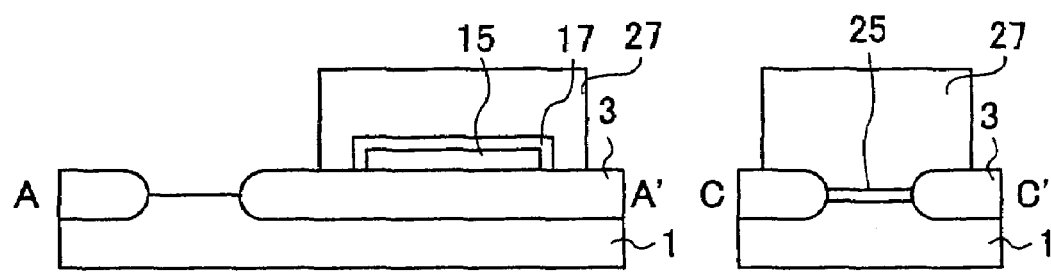
Figure 3D:
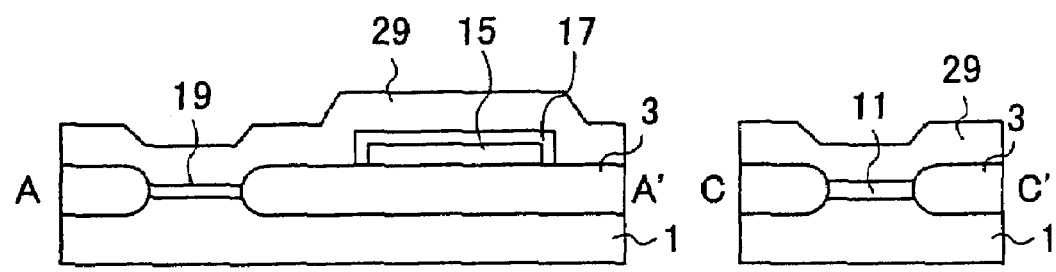
Figure 4A:
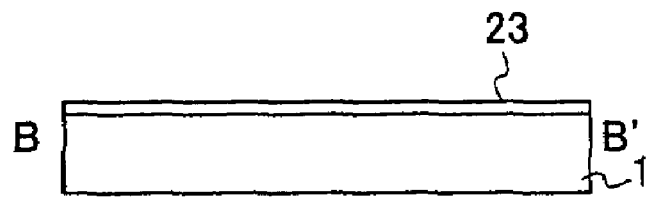
FIG. 4 is for explaining steps of the first embodiment, a second embodiment and a third embodiment of the manufacturing method, and shows sectional views in the B-B' cross-section of the sub-section (A) of FIG. 1.
Figure 4B:
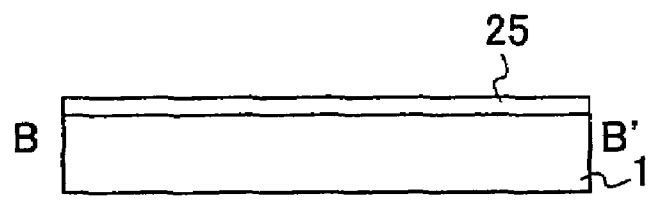
Figure 4C:
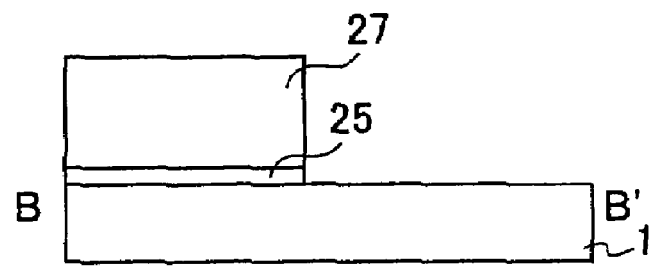
Figure 4D:
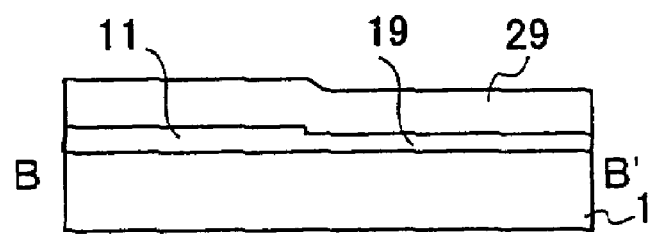
Figure 5A:
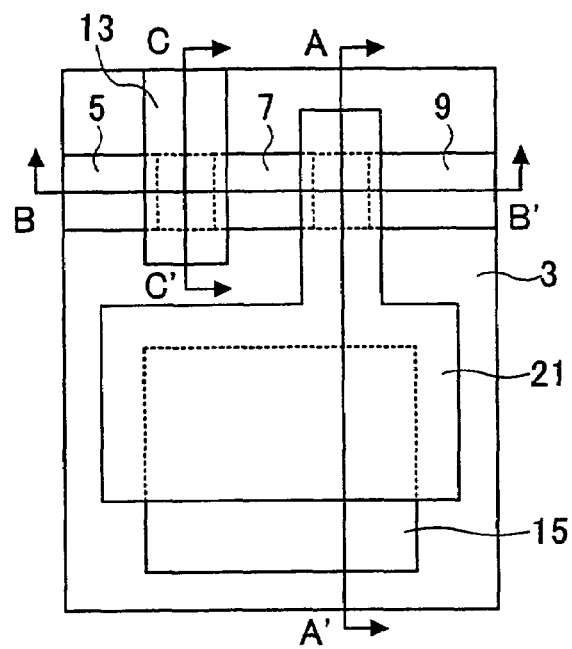
FIG. 5 shows a second embodiment of the semiconductor device. A plan view is shown at sub-section (A), a sectional view in the A-A' cross-section of the sub-section (A) is shown at sub-section (B), a sectional view in the B-B' cross-section of the sub-section (A) is shown at sub-section (C), and a sectional view in the C-C' cross-section of the sub-section (A) is shown at sub-section (D).
Figure 5B:
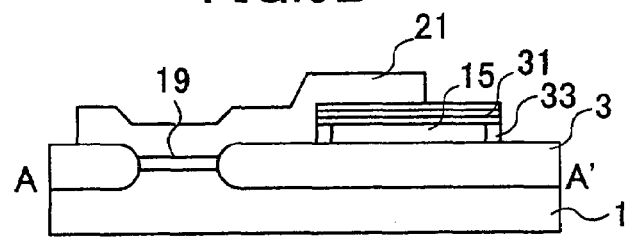
Figure 5C:
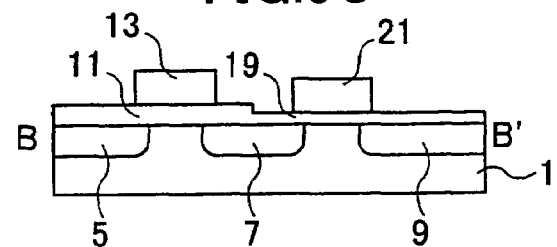
Figure 5D:
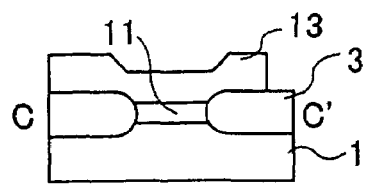
Figure 6A:
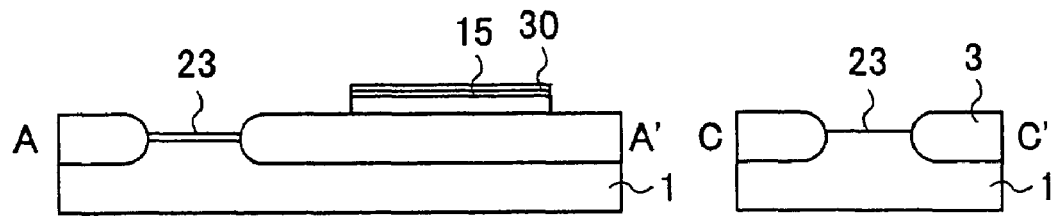
FIG. 6 shows sectional views for explaining the second embodiment of the manufacturing method, which are in the A-A' cross-section and C-C' cross-section of the sub-section (A) of FIG. 5.
Figure 6B:
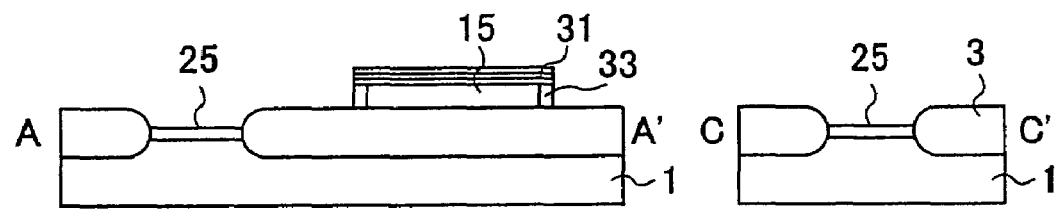
Figure 6C:
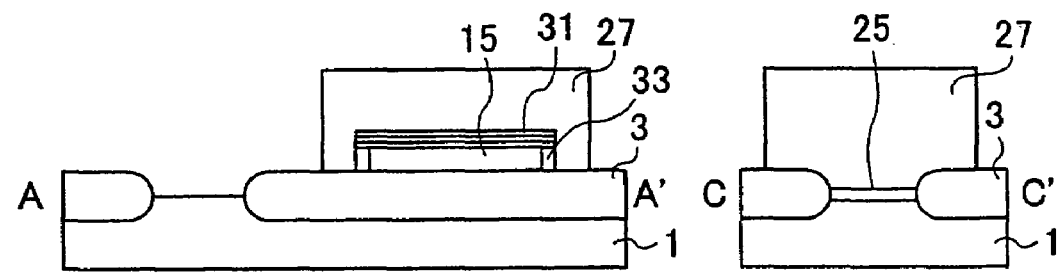
Figure 6D:
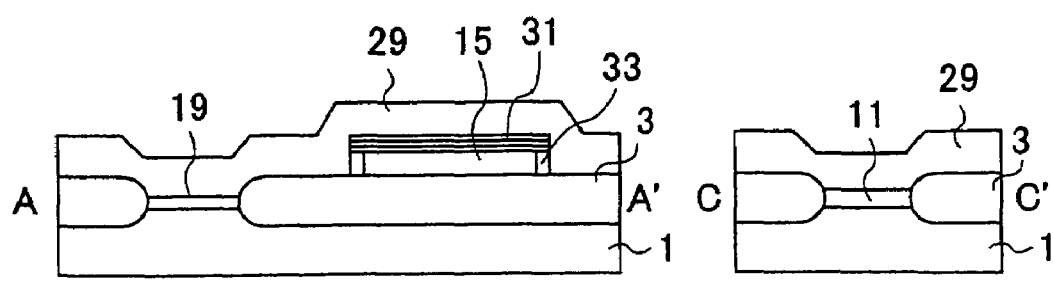
Figure 7A:
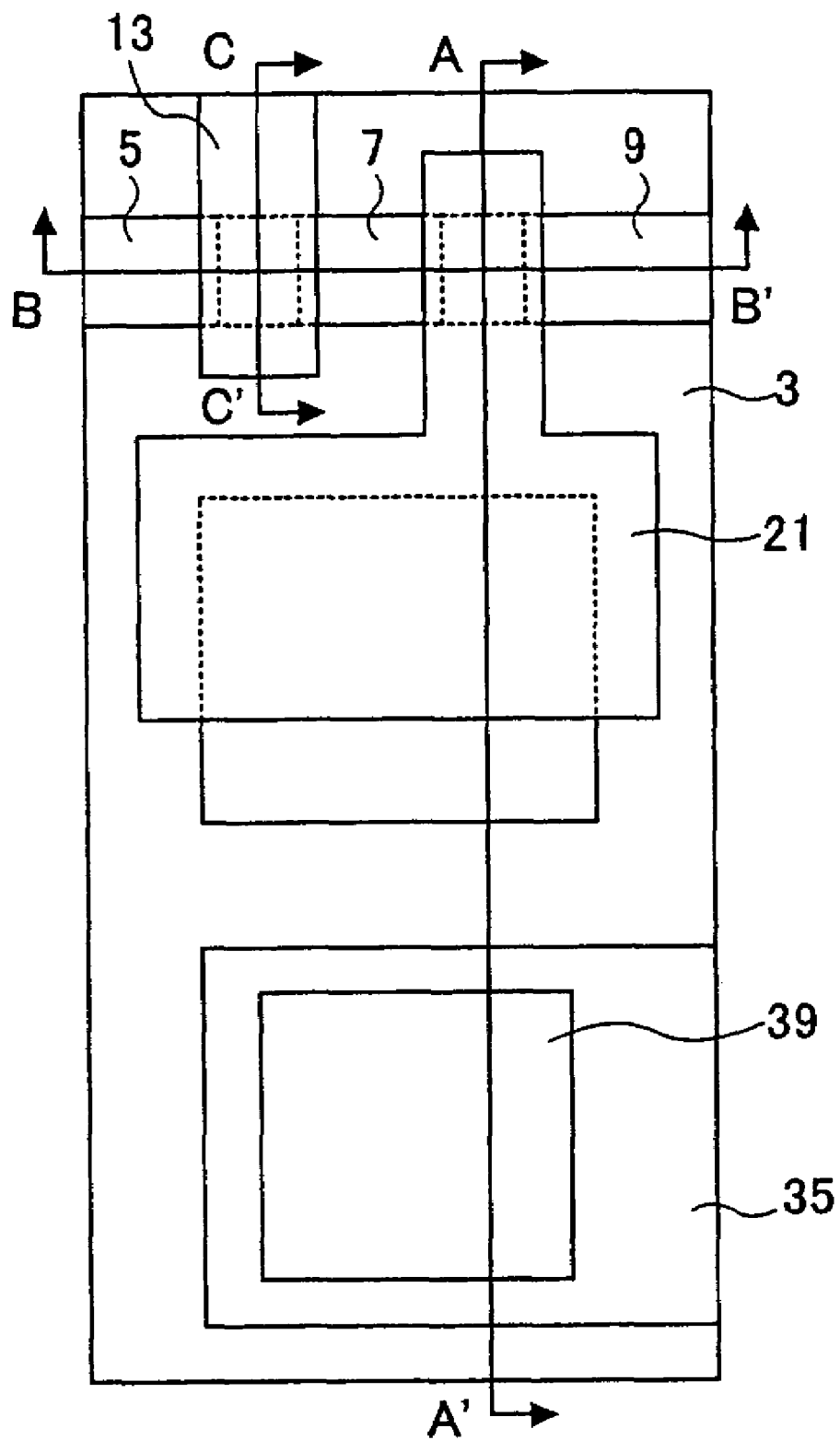
FIG. 7 shows a third embodiment of the semiconductor device. A plan view is shown at sub-section (A). Sub-section (B) shows a sectional view in the sectional view in the A-A' cross-section, sub-section (C) shows a sectional view in the B-B' cross-section, and sub-section (D) shows a sectional views in the C-C' cross-section of the sub-section (A).
Figure 7B:
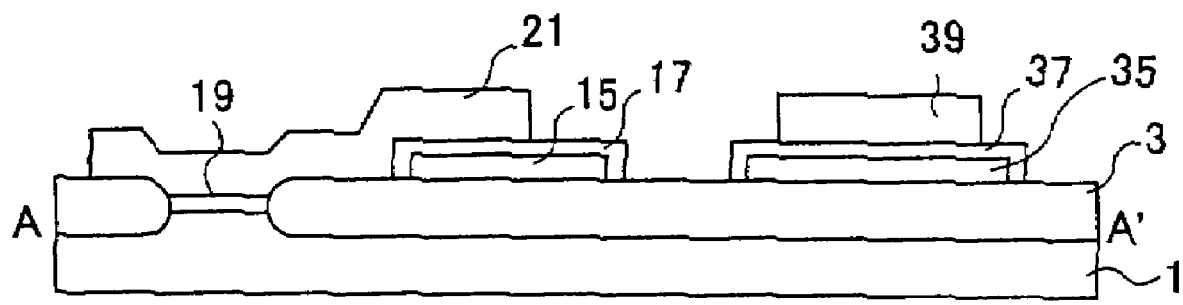
Figure 7C:
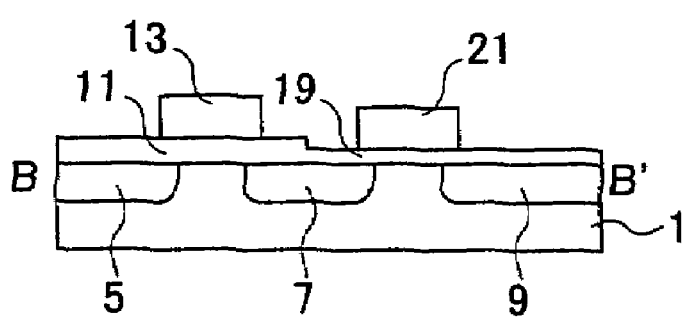
Figure 7D:
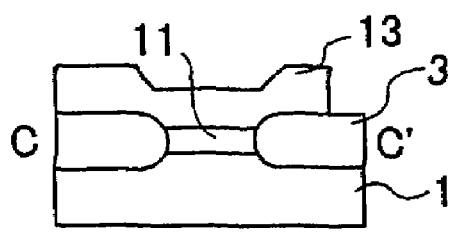
Figure 8A:
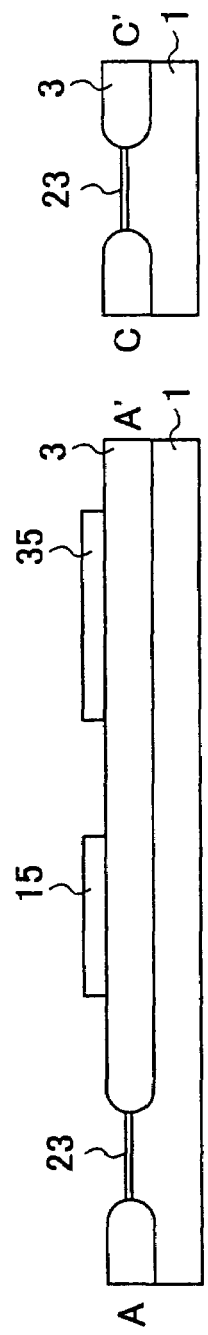
FIG. 8 shows sectional views for explaining the third embodiment of the manufacturing method, which are in the A-A' cross-section and the C-C' cross-section of the sub-section (A) of FIG. 7.
Figure 8B:
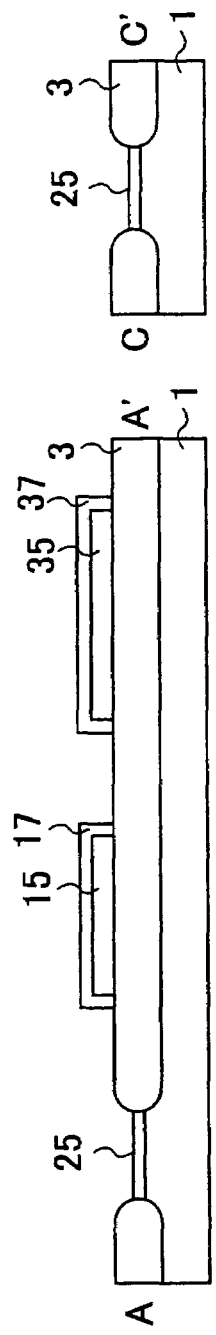
Figure 8C:
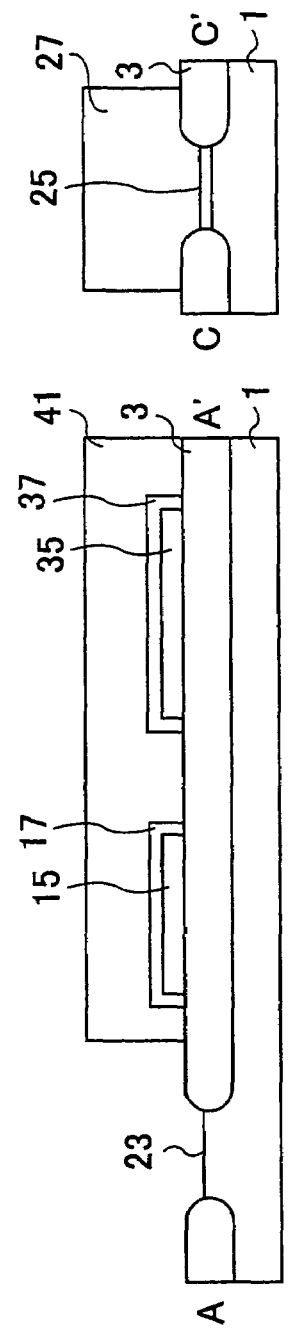
Figure 8D:
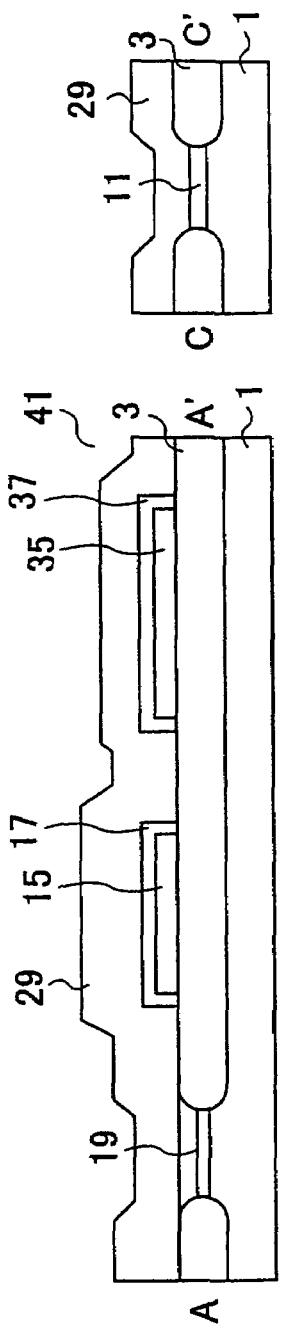
Figure 9A:
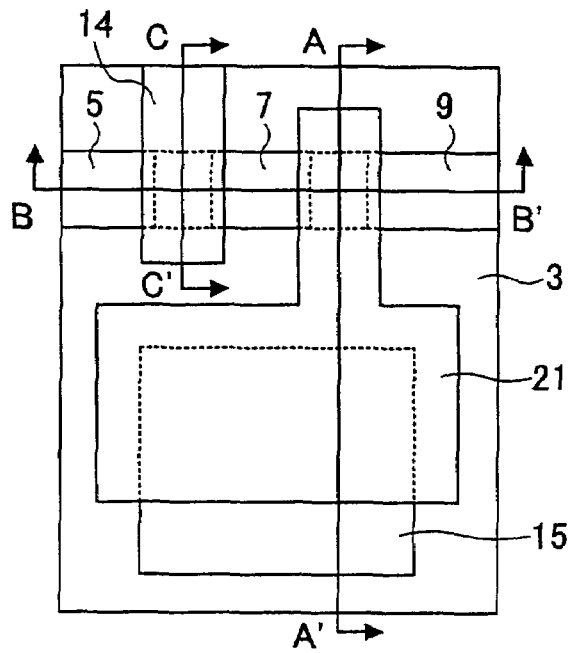
FIG. 9 shows a fourth embodiment of the semiconductor device. Sub-section (A) shows a plan view. Sub-section (B) shows a sectional view in the A-A' cross-section, sub-section (C) shows a sectional view in the B-B' cross-section, and sub-section (D) shows a sectional views in the C-C' cross-section of the sub-section (A).
Figure 9B:
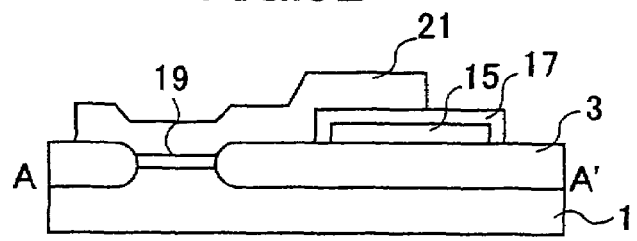
Figure 9C:
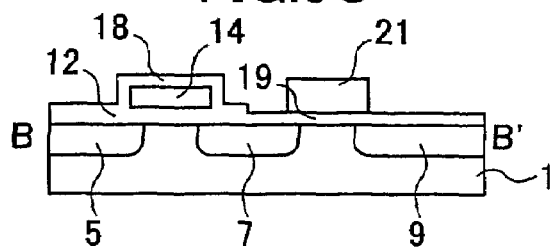
Figure 9D:
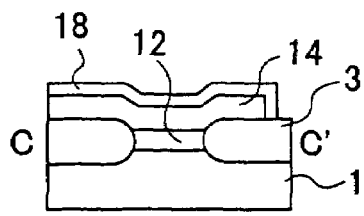
Figure 10A:
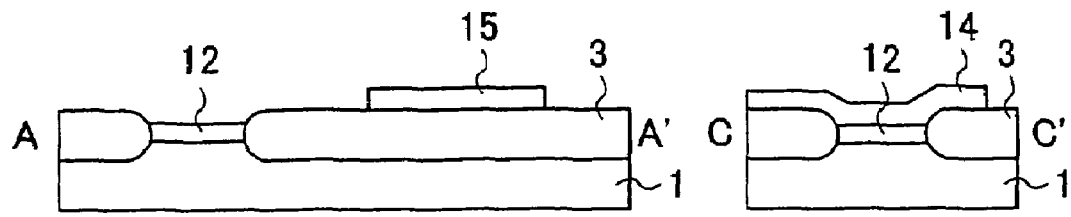
FIG. 10 shows sectional views for explaining a fourth embodiment of the manufacturing method, which show the sectional views in the A-A' cross-section and C-C' cross-section of the sub-section (A) of FIG. 9.
Figure 10B:
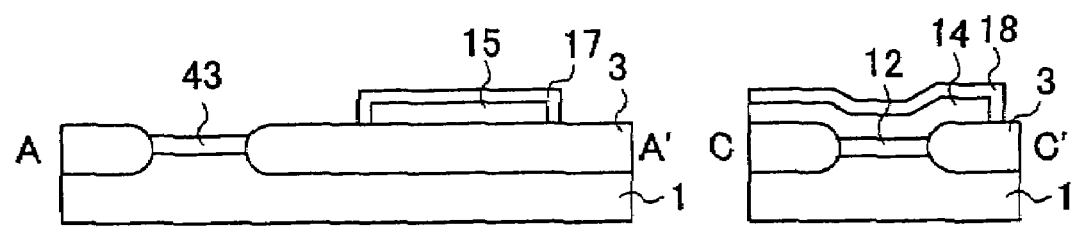
Figure 10C:
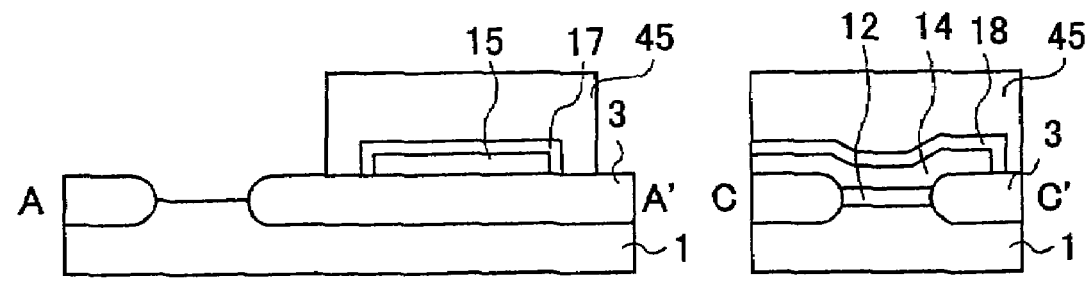
Figure 10D:
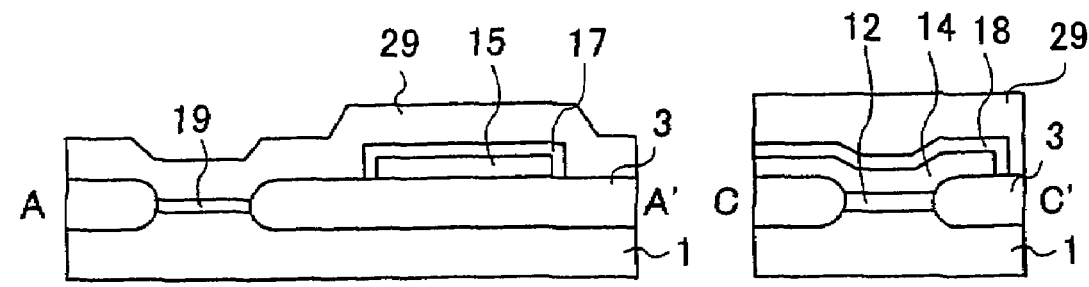
Figure 11A:
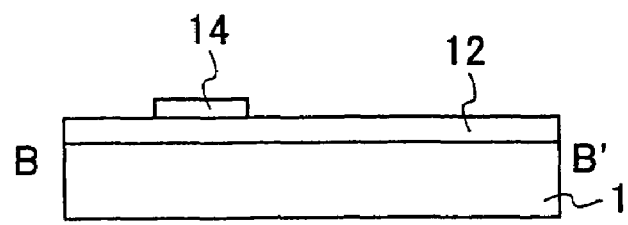
FIG. 11 shows sectional views for explaining the fourth embodiment of the manufacturing method, which are in the B-B' cross-section of the sub-section (A) of FIG. 9.
Figure 11B:
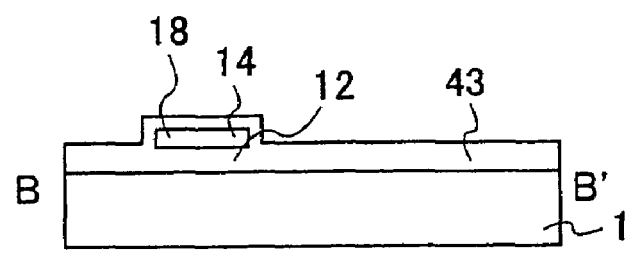
Figure 11C:
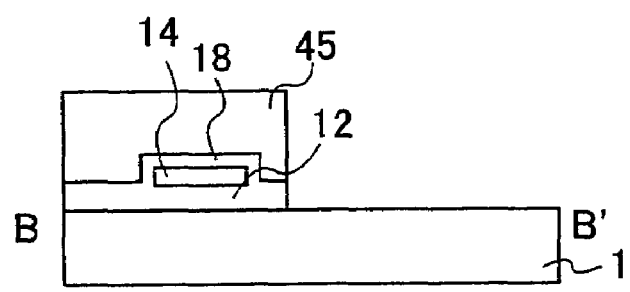
Figure 11D:
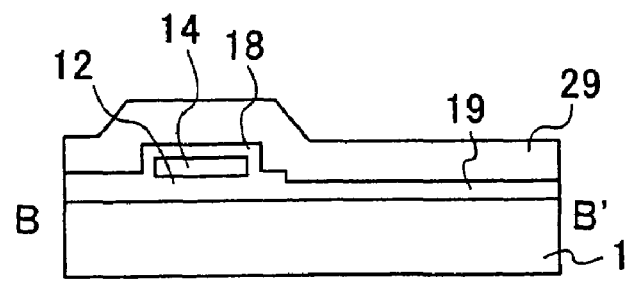
Figure 12A:
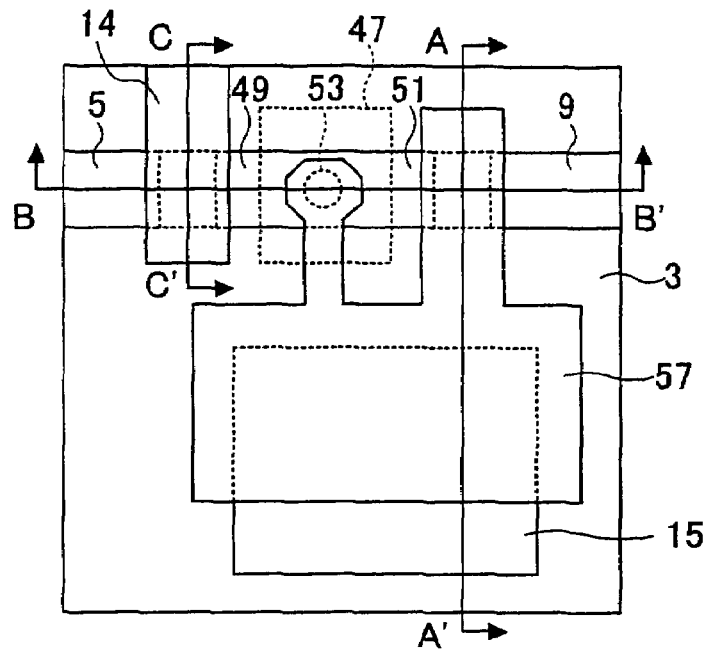
FIG. 12 shows a fifth embodiment of the semiconductor device. Sub-section (A) shows a plan view. Sub-section (B) shows a sectional view in the A-A' cross-section, sub-section (C) shows a sectional view in the B-B' cross-section, and sub-section (D) shows a sectional views in the C-C' cross-section of the sub-section (A).
Figure 12B:
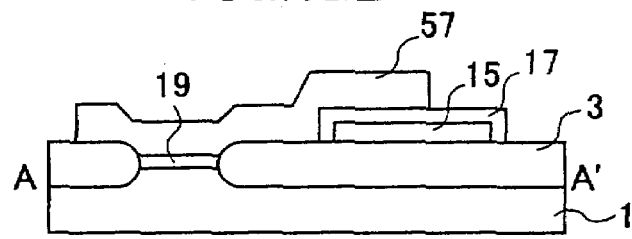
Figure 12C:
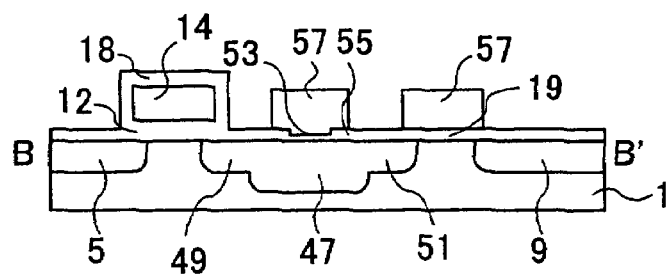
Figure 12D:
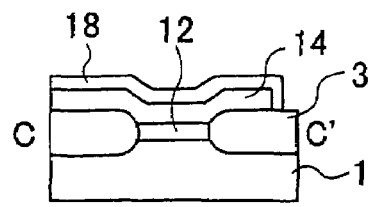
Figure 13A:
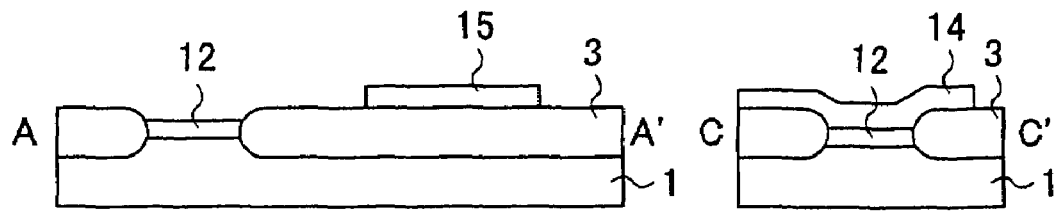
FIG. 13 shows sectional views for explaining a fifth embodiment of the manufacturing method, which are in the A-A' cross-section and the C-C' cross-section of the sub-section (A) of FIG. 12.
Figure 13B:
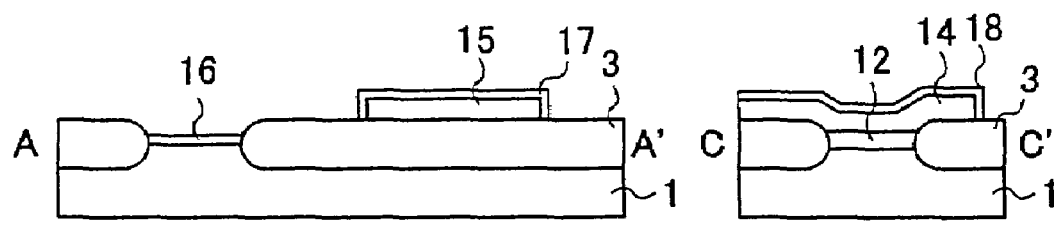
Figure 13C:
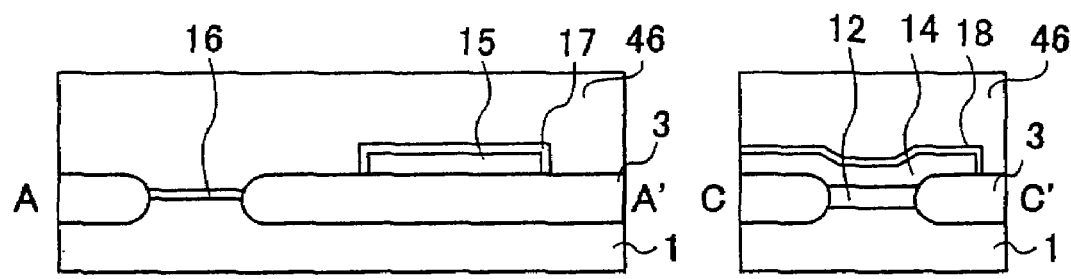
Figure 13D:
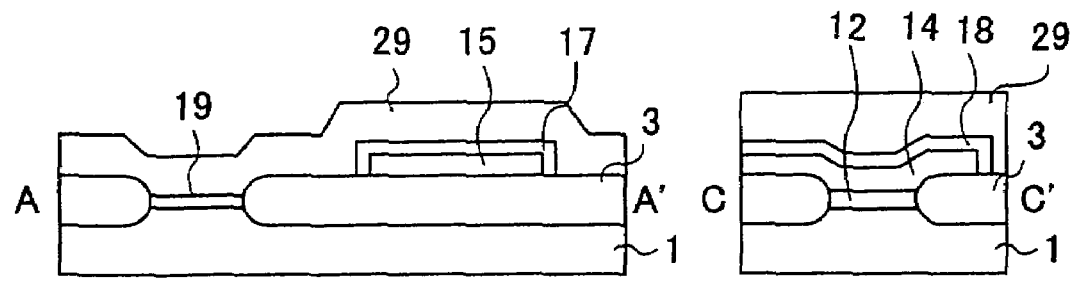
Figure 14A:
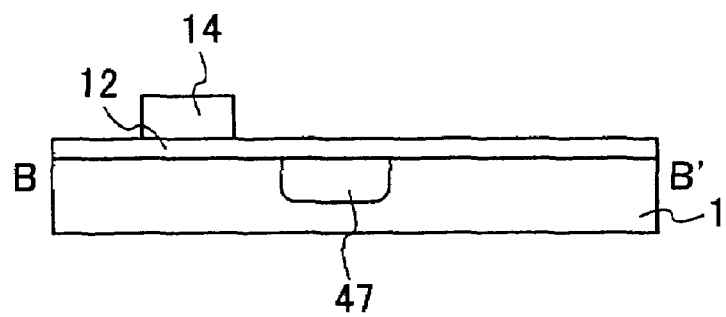
FIG. 14 is the fifth embodiment of the manufacturing method, wherein sectional views in the B-B' cross-section of the sub-section (A) of FIG. 12 are shown.
Figure 14B:
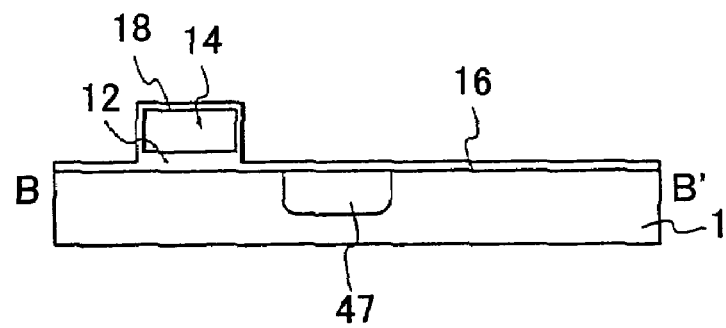
Figure 14C:
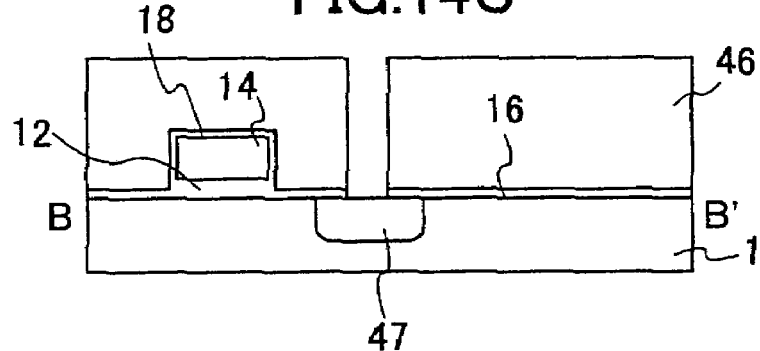
Figure 14D:
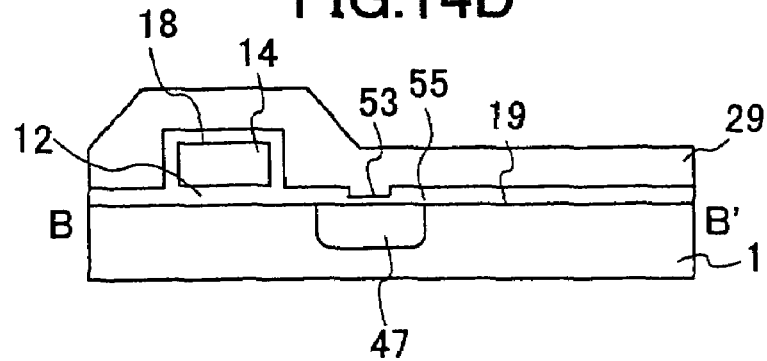
Figure 15A:
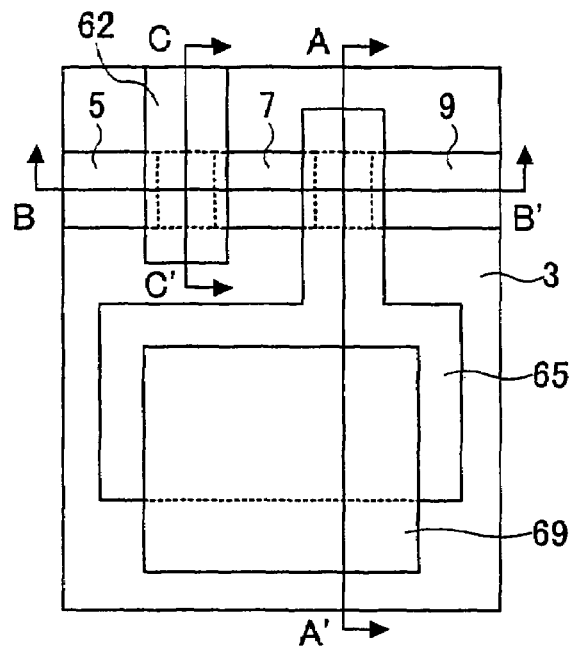
FIG. 15 shows a sixth embodiment of the semiconductor device. Sub-section (A) is a plan view. Sub-section (B) shows a sectional view in the A-A' cross-section, sub-section (C) shows a sectional view in the B-B' cross-section, and sub-section (D) shows a sectional view in the C-C' cross-section of the sub-section (A). Sub-section (E) shows a sectional view of a low voltage transistor formed in an area different from the sub-section (A).
Figure 15B:
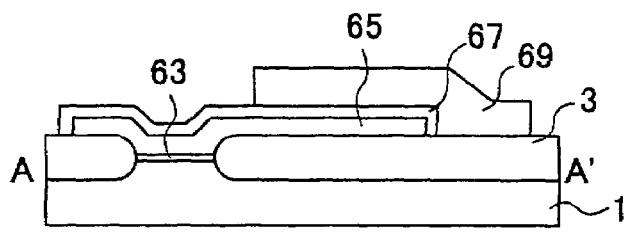
Figure 15C:
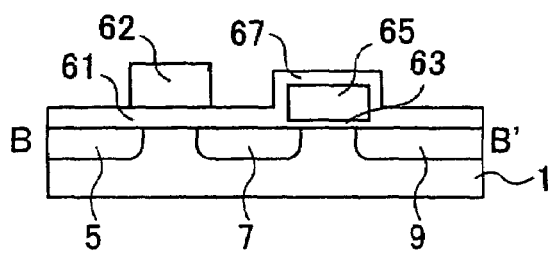
Figure 15D:
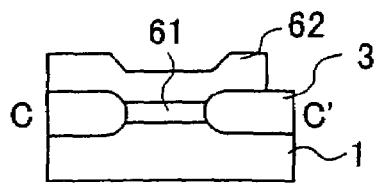
Figure 15E:
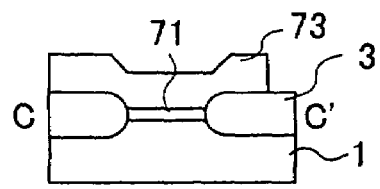
Figure 16A:
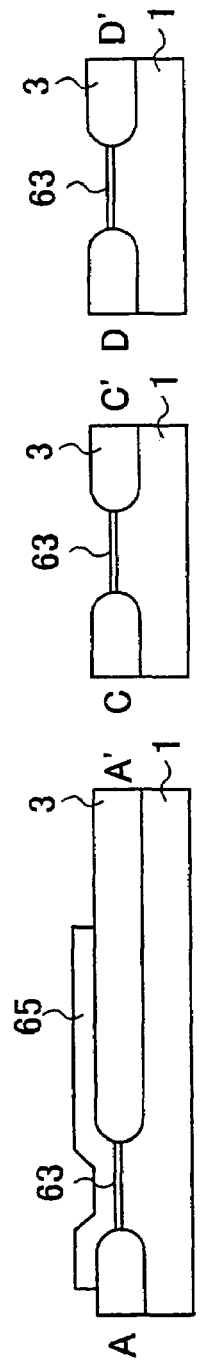
FIG. 16 shows sectional views for explaining a sixth embodiment of the manufacturing method, which are in the A-A' cross-section and the C-C' cross-section of the sub-section (A) of FIG. 15, and in the D-D' cross-section of the sub-section (E) of FIG. 15.
Figure 16B:
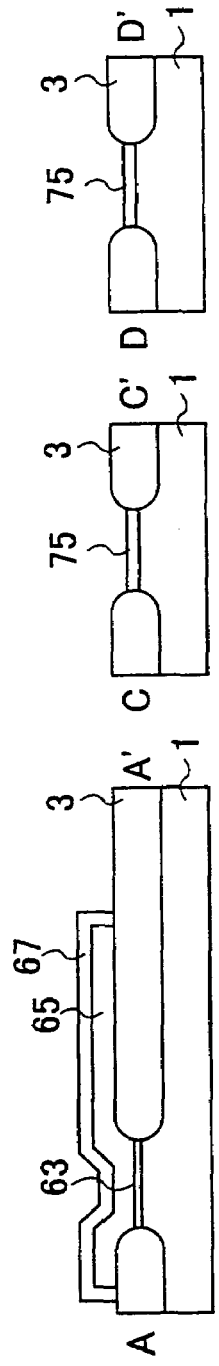
Figure 16C:
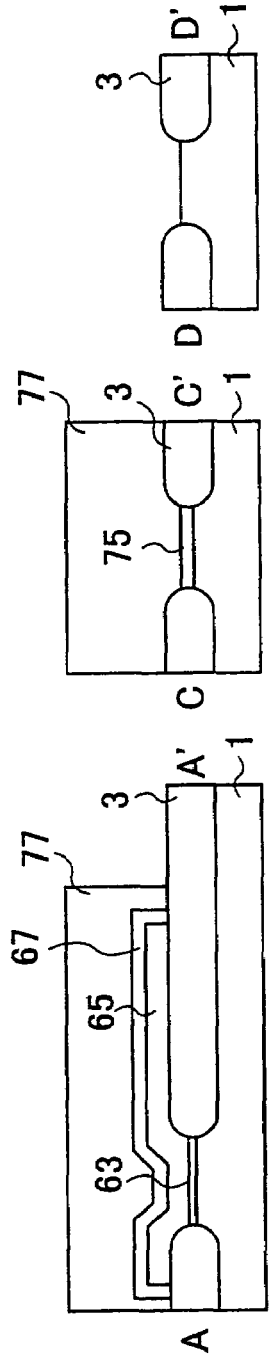
Figure 16D:
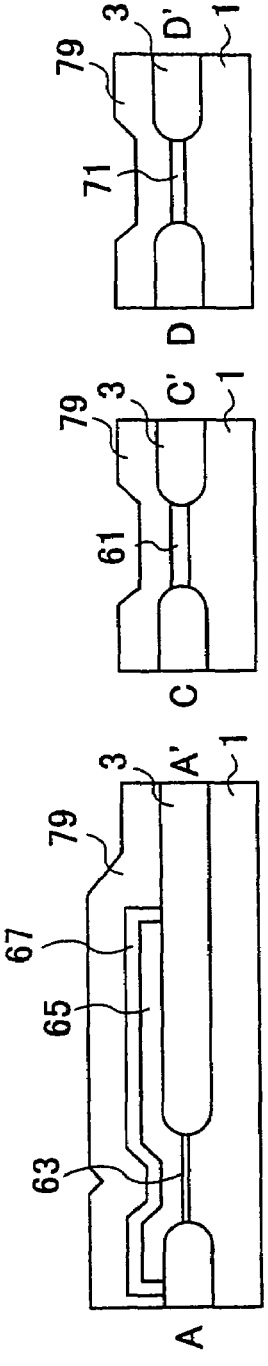
Figure 17A:
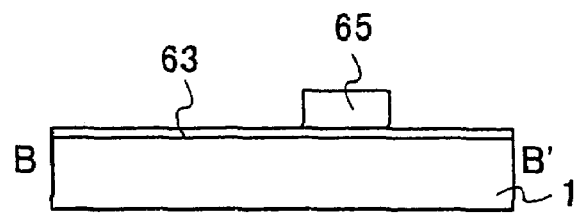
FIG. 17 shows sectional views for explaining the sixth embodiment, a seventh embodiment, and an eighth embodiment of the manufacturing method, which are in the B-B' cross-section of the sub-section (A) of FIG. 15.
Figure 17B:
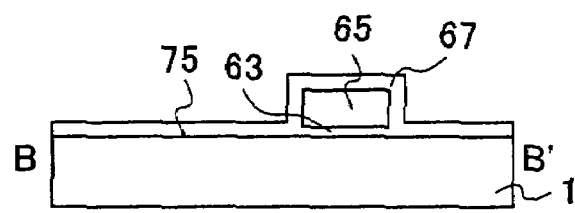
Figure 17C:
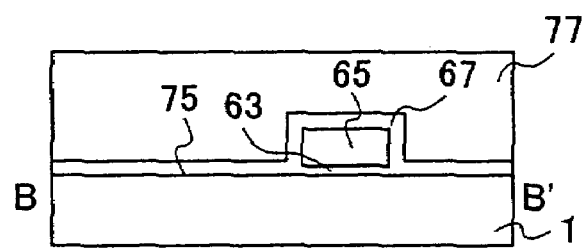
Figure 17D:
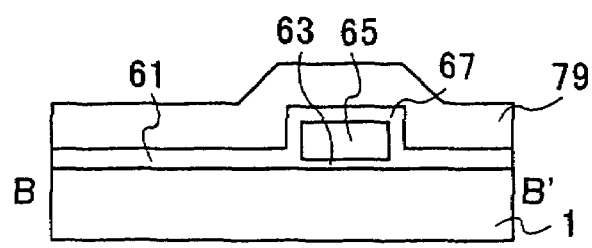
Figure 18A:
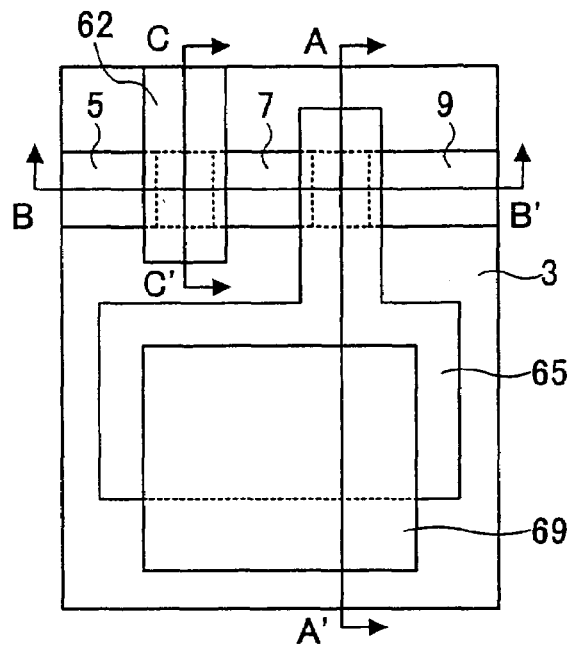
FIG. 18 shows a seventh embodiment of the semiconductor device. Sub-section (A) is a plan view. Sub-section (B) shows a sectional view in the A-A' cross-section, sub-section (C) shows a sectional view in the B-B' cross-section, and sub-section (D) shows a sectional view in the C-C' cross-section of the sub-section (A). Sub-section (E) shows a sectional view of a low voltage transistor formed in an area different from the sub-section (A).
Figure 18B:
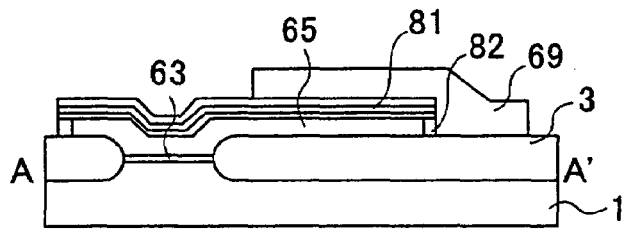
Figure 18C:
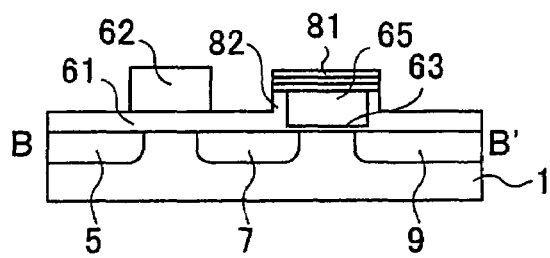
Figure 18D:
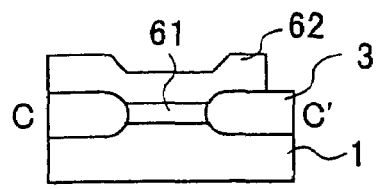
Figure 18E:
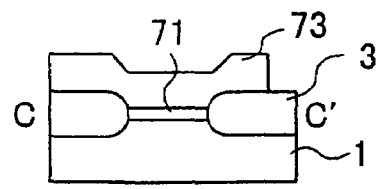
Figure 19A:
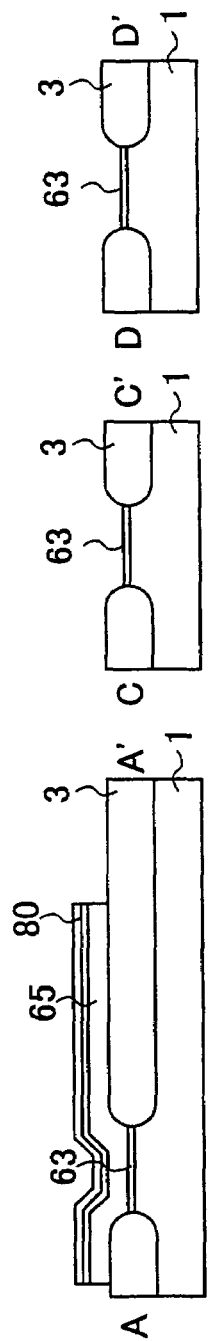
FIG. 19 shows sectional views for explaining the seventh embodiment of the manufacturing method, which are in the A-A' cross-section and the C-C' cross-section of the sub-section (A) of FIG. 18, and in the D-D' cross-section of the sub-section (E) of FIG. 18.
Figure 19B:
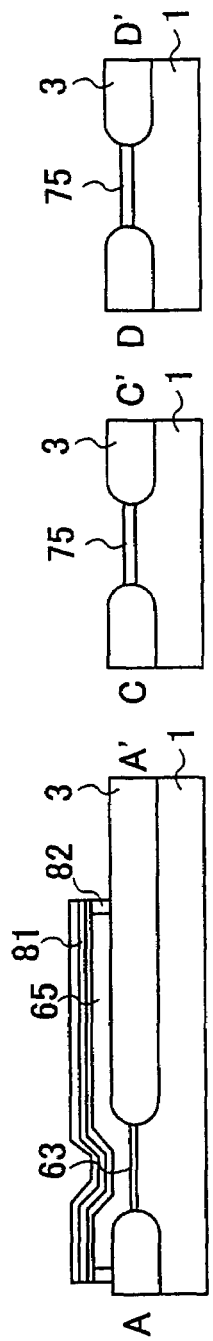
Figure 19C:
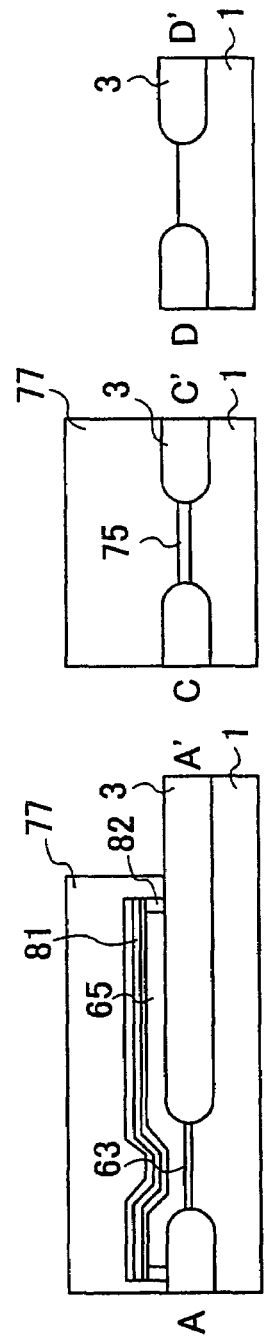
Figure 19D:
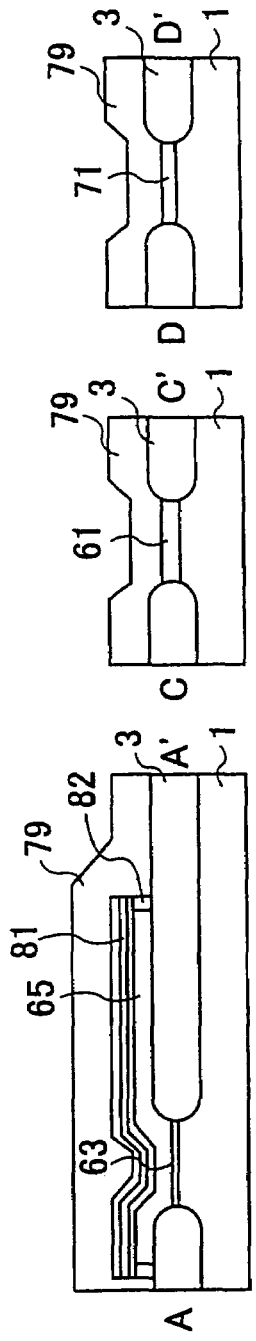
Figure 20A:
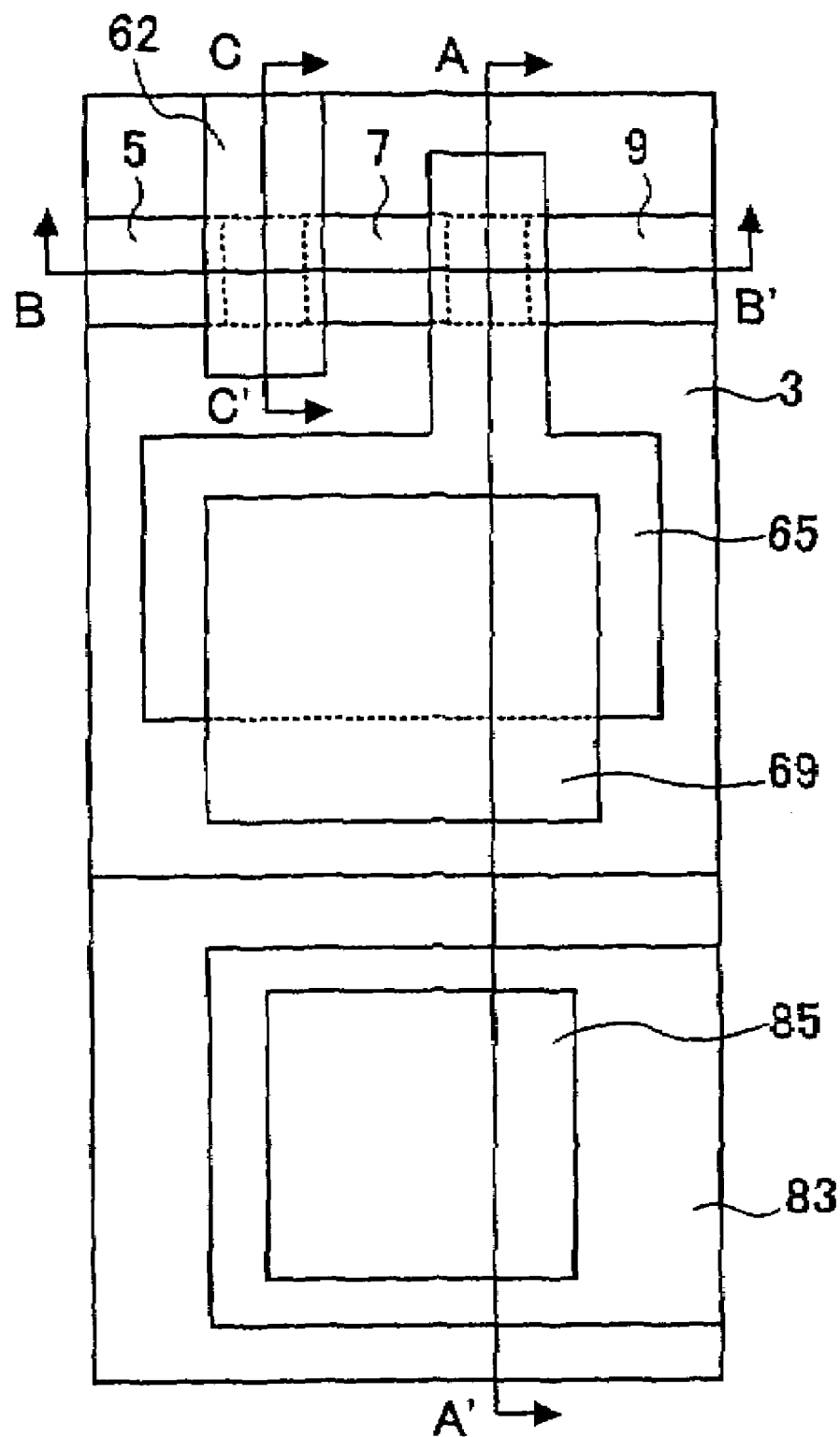
FIG. 20 shows an eighth embodiment of the semiconductor device. Sub-section (A) is a plan view. Sub-section (B) shows a sectional view in the A-A' cross-section, sub-section (C) shows a sectional view in the B-B' cross-section, and sub-section (D) shows a sectional view in the C-C' cross-section of the sub-section (A). Sub-section (E) shows a sectional view of a low voltage transistor formed in an area different from the sub-section (A).
Figure 20B:
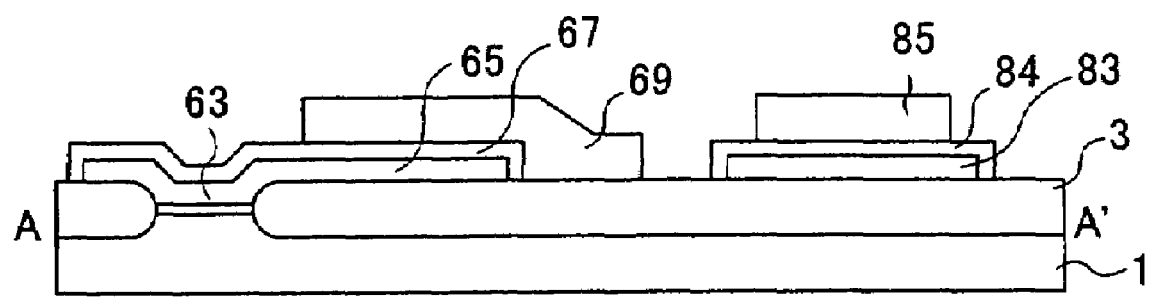
Figure 20C:
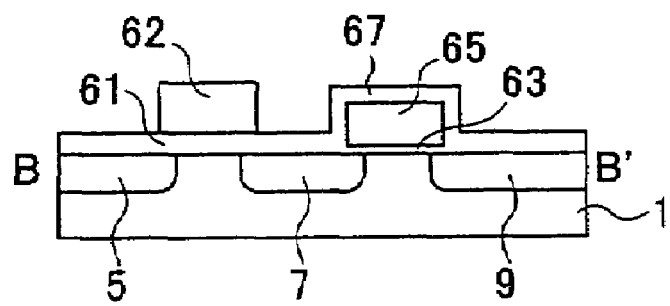
Figure 20D:
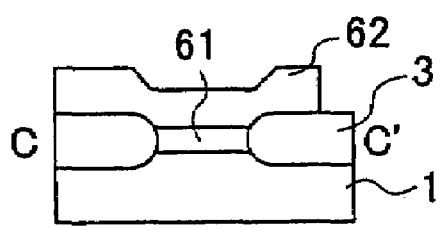
Figure 20E:
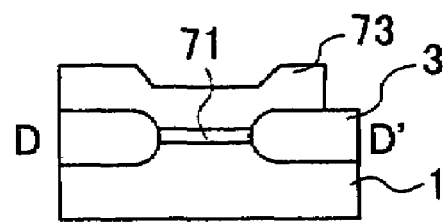
Figure 22A:
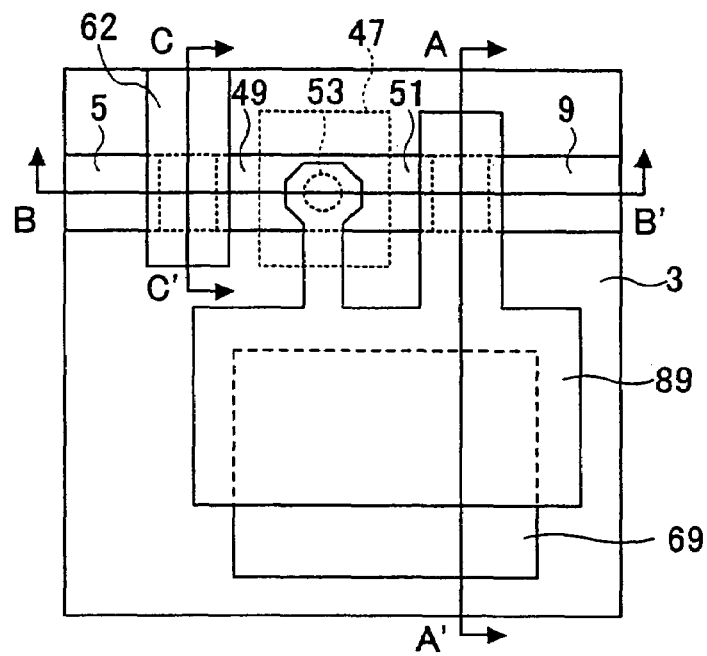
FIG. 22 shows a ninth embodiment of the semiconductor device. Sub-section (A) is a plan view. Sub-section (B) shows a sectional view in the A-A' cross-section, sub-section (C) shows a sectional view in the B-B' cross-section, and sub-section (D) shows a sectional view in the C-C' cross-section of the sub-section (A). Sub-section (E) shows a sectional view of a low voltage transistor formed in an area different from the sub-section (A).
Figure 22B:
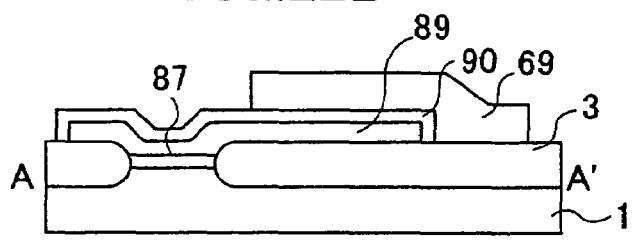
Figure 22C:
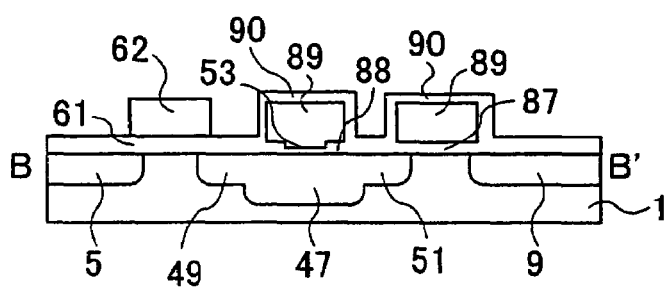
Figure 22D:
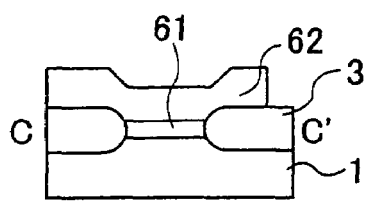
Figure 22E:
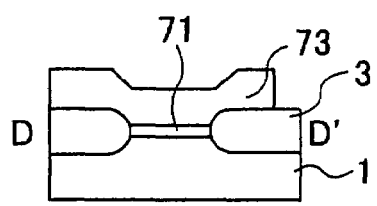
Figure 23A:
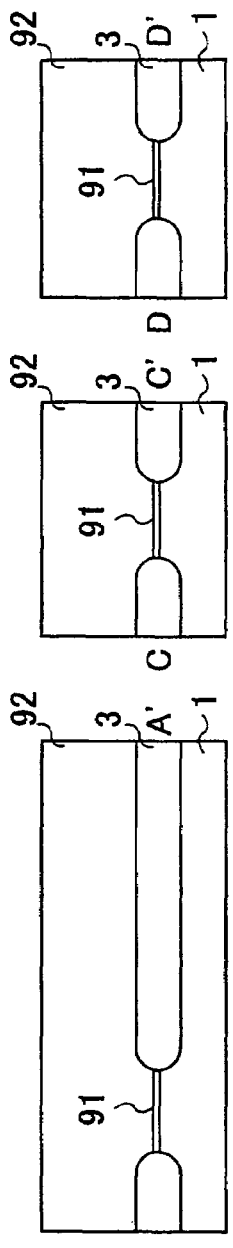
FIG. 23 shows sectional views for explaining the ninth embodiment of the manufacturing method, which are in the A-A' cross-section and the C-C' cross-section of the sub-section (A) of FIG. 22, and in the D-D' cross-section of the sub-section (E) of FIG. 22.
Figure 23B:
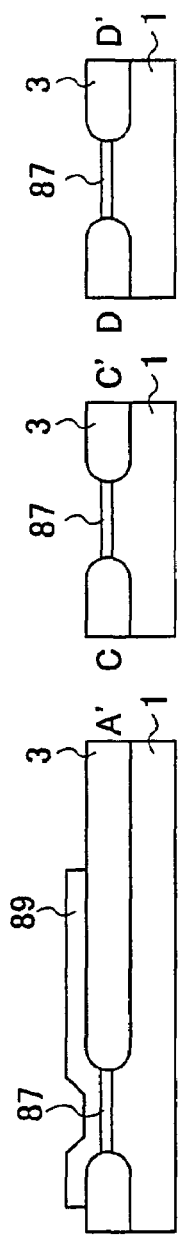
Figure 23C:
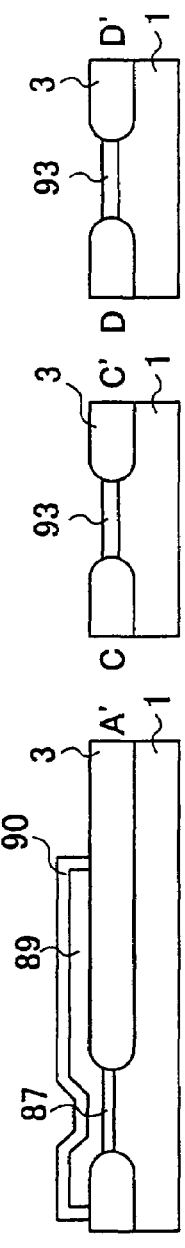
Figure 23D:
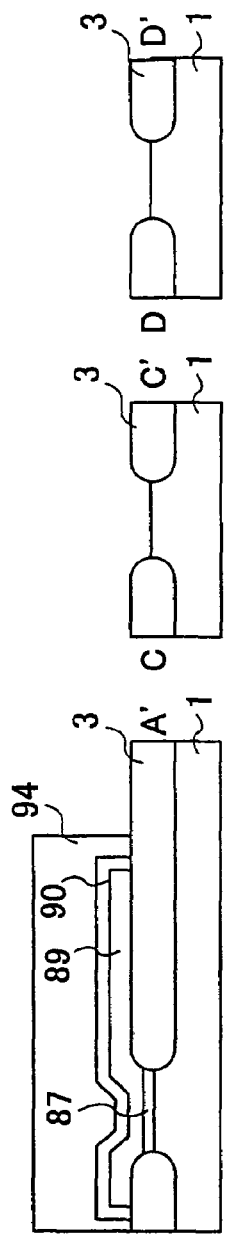
Figure 23E:
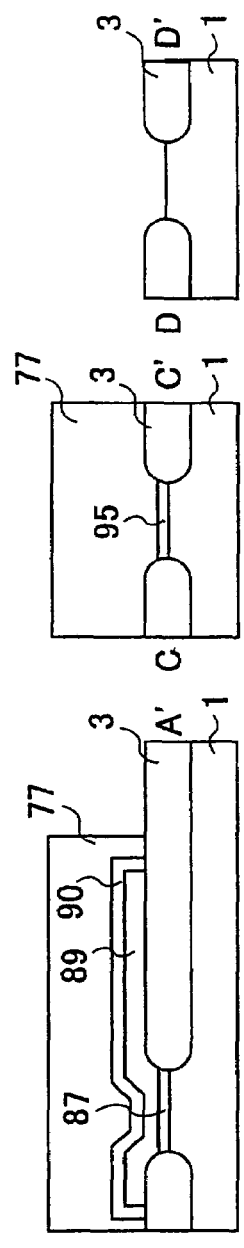
Figure 24A:
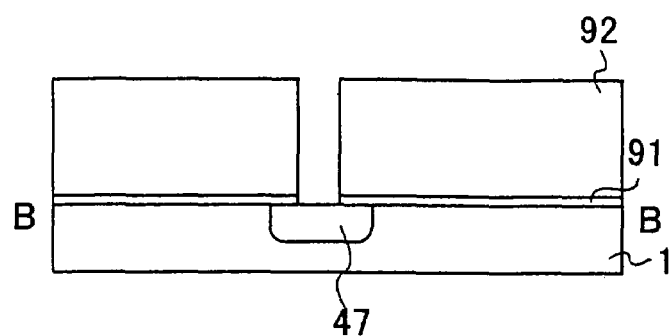
FIG. 24 shows sectional views for explaining the ninth embodiment of the manufacturing method, which are in the B-B' cross-section of the sub-section (A) of FIG. 22.
Figure 24B:
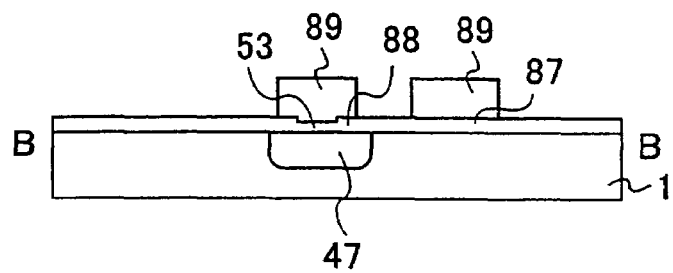
Figure 24C:
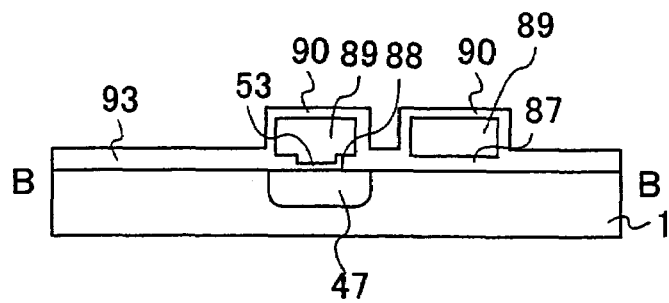
Figure 24D:
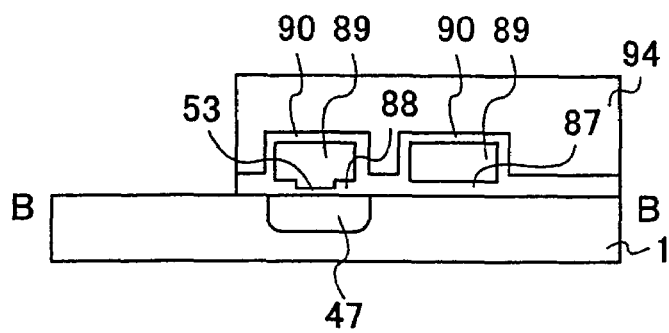
Figure 24E:
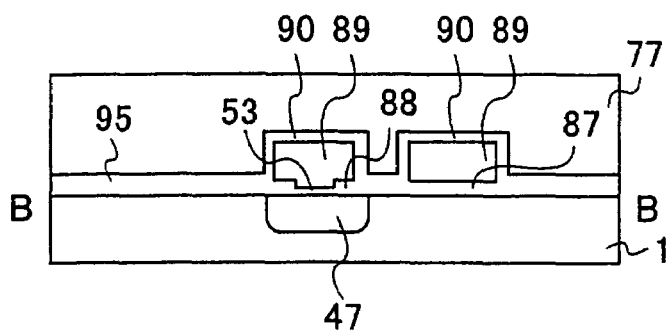
Figure 25A:
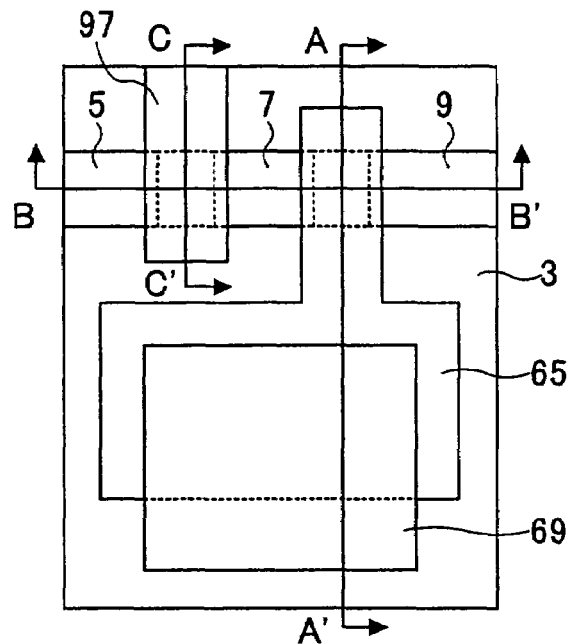
FIG. 25 shows a tenth embodiment of the semiconductor device. Sub-section (A) is a plan view. Sub-section (B) shows a sectional view in the A-A' cross-section, sub-section (C) shows a sectional view in the B-B' cross-section, and sub-section (D) shows a sectional view in the C-C' cross-section of the sub-section (A). Sub-section (E) shows a sectional view of a low voltage transistor formed in an area different from the sub-section (A).
Figure 25B:
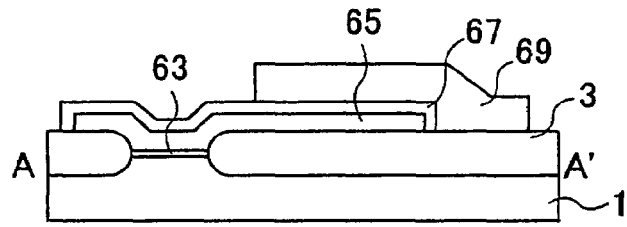
Figure 25C:
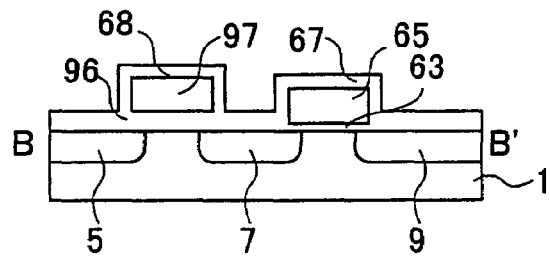
Figure 25D:
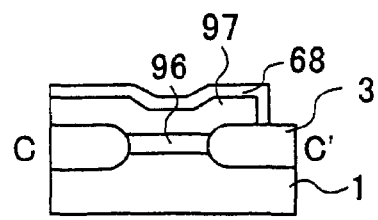
Figure 25E:
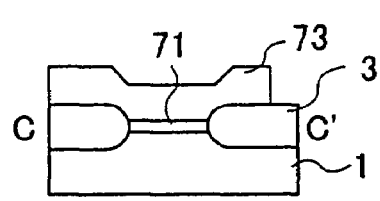
Figure 26A:
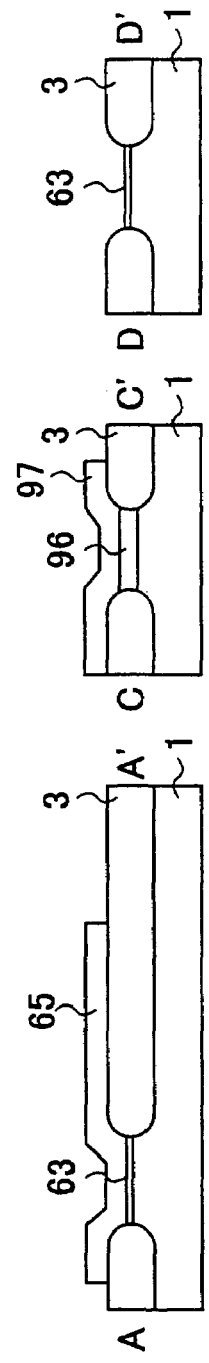
FIG. 26 shows sectional views for explaining a tenth embodiment of the manufacturing method, which are in the A-A' cross-section and the C-C' cross-section of the sub-section (A) of FIG. 25, and in the D-D' cross-section of the sub-section (E) of FIG. 25.
Figure 26B:
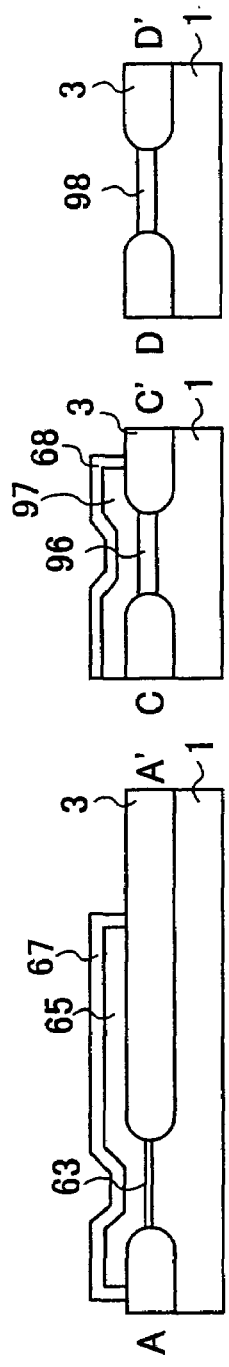
Figure 26C:
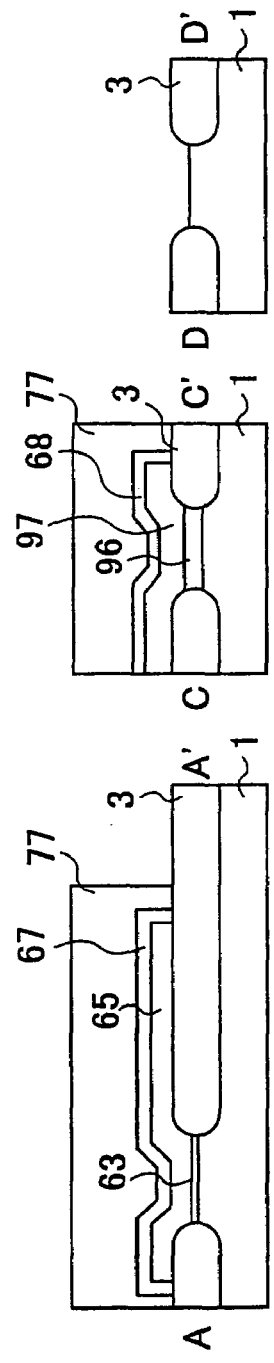
Figure 26D:
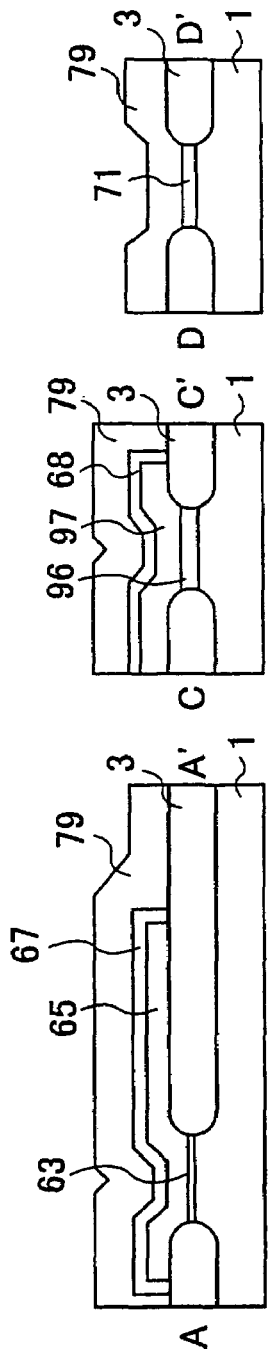
Figure 27A:
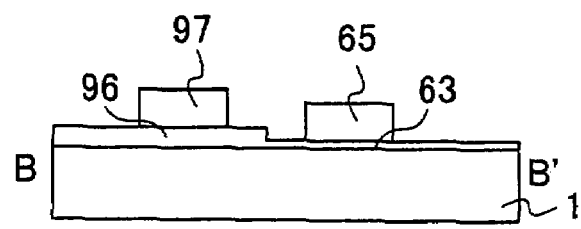
FIG. 27 shows sectional views for explaining the tenth embodiment of the manufacturing method, which are in the B-B' cross-section of the sub-section (A) of FIG. 25.
Figure 27B:
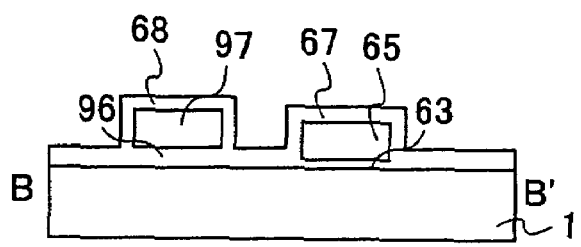
Figure 27C:
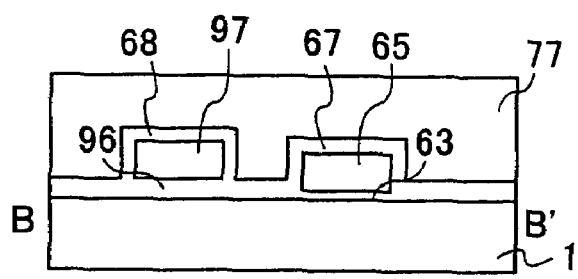
Figure 27D:
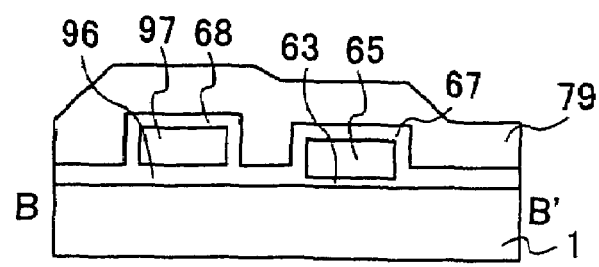
Figure 28:
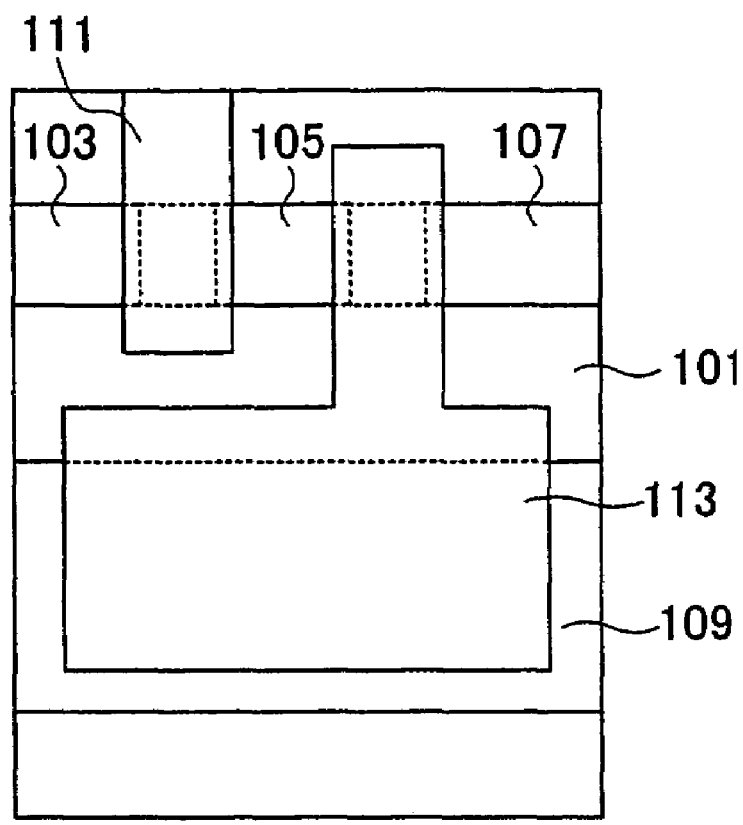
FIG. 28 is a plan view showing an example of a conventional one-layer gate type non-volatile memory.
Figure 29:
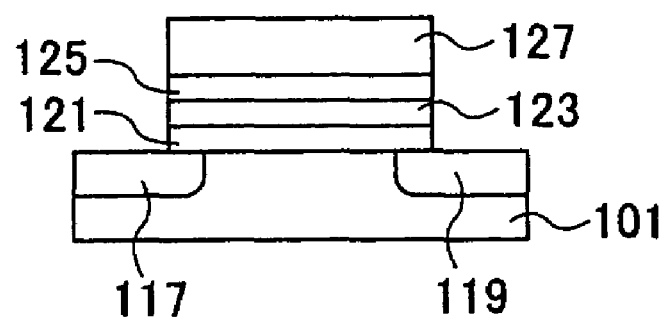
FIG. 29 is a sectional view showing an example of a conventional two-layer gate type non-volatile memory.
Figure 30A:
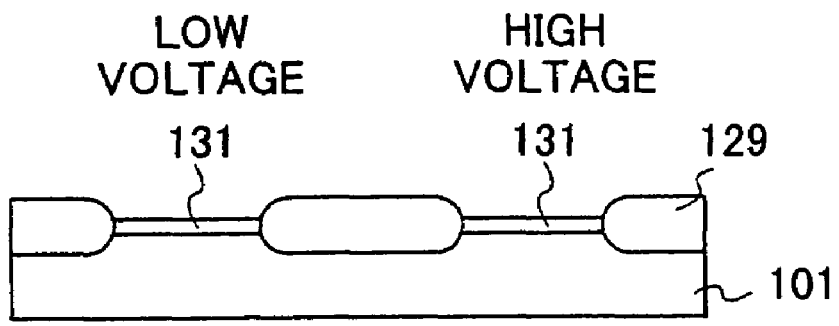
FIG. 30 shows sectional views showing a process that forms a gate oxide film in two different values of film thickness.
Figure 30B:
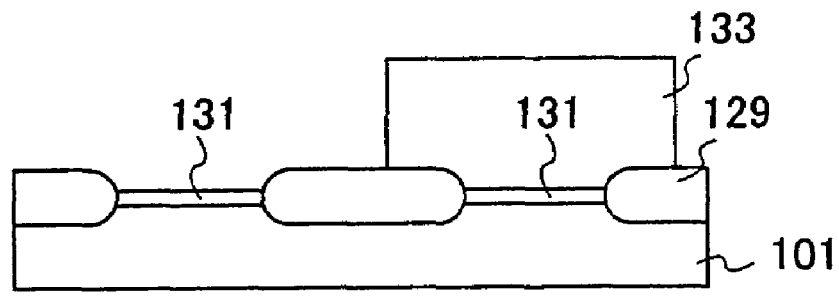
Figure 30C:
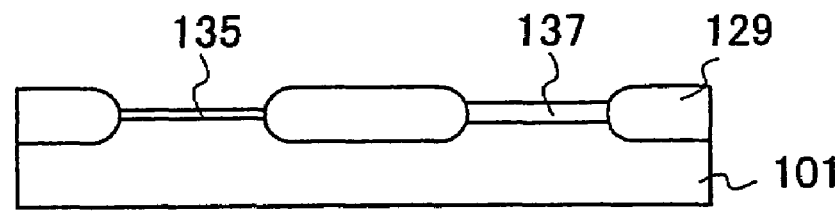
Figure 30D:
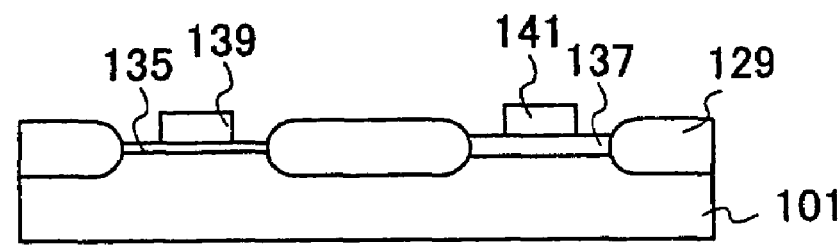

FIG. 2 is a circuit diagram showing an example of the memory unit of the first embodiment of the semiconductor device arranged in a matrix form.

The memory unit (cell) is arranged in a matrix.

The selection gate 13 of cells i0, i1, and so on that are aligned in the horizontal direction (word line WL direction) is electrically connected to a common word line WLi, and the control gate 15 is electrically connected to a common control gate line CGi.

The N type diffusion layer 5 of the cells 0i, 1i and so on aligned in the vertical direction (bit line Bit direction) is electrically connected to a common bit line Bit, and the N type diffusion layer 9 is electrically connected to a common VG (virtual ground) line VGi.

Here, in this embodiment, i represents 0 or a natural number.

When erasing the cells 00, 01 and so on that are aligned in the word line direction, for example, each terminal is to be biased as shown in Table 1.

TABLE 1

Erasing bias conditions

| | BIT0=0V VG0=open | BIT1=0V VG1=open |
|---|---|---|
| WL0=Vpp | Erase (High Vth) | Erase (High Vth) |
| CG0=Vpp | (cell 00) | (cell 01) |
| WL0=0V | Hold | Hold |
| CG0=0V | (cell 10) | (cell 11) |

The word line WL0 and the control gate line CG 0 of a block to be erased are biased at a predetermined potential Vpp, with other word lines WLi and other control gate lines CGi being biased at 0V, all the bit lines Biti being biased at 0V, and all the VG lines VGi being open. Thereby, an electron is injected into the floating gate 21 of the cells 00, 01 and so on that are connected to the word line WL0 and the control gate line CG 0, via the gate oxide film for the memory, and a comprehensive erasing is carried out. At this time, the cells of the block connected to the word line WLi and the control gate line CGi that are biased at 0V are not erased.

When writing to only the cell 00, for example, each terminal is to be biased as shown in Table 2.

TABLE 2

Writing bias conditions

| | BIT0=Vpp VG0=open | BIT1=0V VG1=open |
|---|---|---|
| WL0=Vpp | Write (Dep) | No Writing (High Vth) |
| CG0=0V | (cell 00) | (cell 01) |
| WL0=0V | Hold | Hold |
| CG0=0V | (cell 10) | (cell 11) |

All the control gate lines CGi are biased at 0V, with only the word line WL0 and the bit line Bit0 that are connected to the cell 00 that is to be written to being biased at the predetermined potential Vpp, other word lines WLi and other bit lines Biti being biased at 0V, and all the VG lines VGi being open. Thereby, an electron injected into the floating gate 21 of the cell 00 is drawn out to the N type diffusion layer 7 through the gate oxide film for the memory by the tunnel effect, and only the cell 00 is selectively written to.

FIGS. 3 and 4 show sectional views for explaining the first embodiment of the manufacturing method for manufacturing the semiconductor device of the first embodiment. FIG. 3 shows sectional views of the sub-section (A) of FIG. 1 in the A-A' cross-section and in the C-C' cross-section. FIG. 4 shows sectional views of the sub-section (A) of FIG. 1 in the B-B' cross-section. With reference to FIG. 1, FIG. 3, and FIG. 4, the embodiment of this manufacturing method is explained.

(1) The field oxide film 3 for unit separation is formed on the P substrate 1 by the usual LOCOS (Local Oxidation of Silicon) method. A sacrifice oxide film 23 in thickness between 250A and 400A is formed on the active region surface demarcated by the field oxide film 3, and a channel dope injection is performed. A poly silicon film in thickness between 2500A and 4500A is deposited all over the upper surface of the P substrate 1, and the control gate 15 is formed on the field oxide film 3 by phototype process technology and etching (refer to sub-section (a) of FIG. 3, and sub-section (a) of FIG. 4).

(2) The inter-layer silicon oxide film 17 is formed on the surface of the control gate 15 in thickness between 150A and 250A by a heat oxidization process. At this time, the sacrifice oxide film 23 in the memory unit region grows up to have film thickness of, e.g., between 350A and 550A, and turns into the silicon oxide film 25 (refer to sub-section (b) of FIG. 3 and sub-section (b) of FIG. 4).

(3) A resist pattern 27 is formed such that the control gate 15 and the gate oxide film 25 in the high-voltage transistor region are covered, and the silicon oxide film 25 in the memory unit region is selectively removed (refer to sub-section (c) of FIG. 3 and sub-section (c) of FIG. 4).

(4) After removing the resist pattern 27, a heat oxidization process is performed such that the gate oxide film 19 for the memory that is 90-100A thick is formed on the surface of the memory unit region of the P substrate 1. At this time, the silicon oxide film 25 of the high-voltage transistor region grows up to have film thickness between 400A and 600A, and turns into the high voltage endurance gate oxide film 11. Then, the poly silicon film 29 that is 2500-4500A thick, for example, is deposited (refer to sub-section (d) of FIG. 3 and sub-section (d) of FIG. 4).

(5) The selection gate 13 is formed on the field oxide film 3 of a high-voltage transistor region, and the high voltage endurance gate oxide film 11 from the poly silicon film 29, by phototype process technology and etching technology, and the floating gate 21 is formed on the gate oxide film 19 for the memory in the memory unit region, the field oxide film 3, and the control gate 15. At this time, although not shown in the figure, a gate electrode of a transistor that makes up a peripheral circuit can also be simultaneously formed from the poly silicon film 29. Then, the N type diffusion layers 5, 7, and 9 are formed on the P substrate 1, using the selection gate 13 and the floating gate 21 as a mask by ion implantation of phosphor or arsenic under a condition such as injecting energy being 70 KeV and a dose amount being $6 \times 10^{15}/cm^2$ (refer to FIG. 1).

In this embodiment, the inter-layer silicon oxide film 17 and the gate oxide film 25 of the high-voltage transistor region may be formed by a heat oxidization process after removing the sacrifice oxide film 23, and the gate oxide film 19 for the memory may be formed after selectively removing the silicon oxide film of the memory region. In this case, the gate oxide film of the high-voltage transistor region is made of a twice-oxidized film, wherein film thickness variation can be suppressed, and reliability can be raised.

FIG. 5 shows the second embodiment of the semiconductor device. A plan view is shown at sub-section (A), a sectional view in the A-A' cross-section of the sub-section (A) is shown at sub-section (B), a sectional view in the B-B' cross-section of the sub-section (A) is shown at sub-section (C), and a sectional view in the C-C' cross-section of the sub-section (A) is shown at sub-section (D). Although this embodiment describes only one memory unit, the embodiment is applicable to any number of memory units. This embodiment is explained with reference to FIG. 5. The same numerals are given to the portion that achieves the same function as in the first embodiment shown in FIG. 1, and detailed explanation of the portion is not repeated.

The field oxide film 3 is formed on the surface of the P substrate 1, and the N type diffusion layers 5, 7, and 9 are formed in the active region of the P substrate 1. The high voltage endurance gate oxide film 11 is formed on the surface of the P substrate 1 that includes the interval region between the N type diffusion layers 5 and 7. The selection gate 13 is formed on the high voltage endurance gate oxide film 11.

The control gate 15 is formed on the field oxide film 3 of the memory unit region. A laminating film 31 (not shown in the sub-section (A)) consisting of a silicon oxide film/a silicon nitride film/a silicon oxide film is formed on the upper surface of the control gate 15. Film thickness of the silicon oxide film that is included in the laminating film 31 is between 100A and 150A. Here, in this embodiment, the thickness is 150A. Film thickness of the silicon nitride film is between 100A and 200A. Here, in this embodiment, the thickness is 150A.

On the side of the control gate 15, a poly silicon oxide film sidewall 33 is formed, which is 150-250A thick. Here, in this embodiment, the thickness is 200A.

The laminating film 31 and the poly silicon oxide film sidewall 33 constitute the second insulation film of the semiconductor device of the present invention.

The gate oxide film 19 for the memory is formed on the surface of the P substrate 1 that includes the interval region between the N type diffusion layers 7 and 9. The floating gate 21 of a poly silicon film is formed on the laminating film 31, the field oxide film 3, and the gate oxide film 19 for the memory.

The memory unit of the second embodiment of the semiconductor device is provided with the laminating film 31 that contains the silicon nitride film through which an electron cannot travel easily between the control gate 15 and the floating gate 21, thereby the reliability of the memory is enhanced.

FIG. 6 shows sectional views for explaining the second embodiment of the manufacturing method for manufacturing the semiconductor device of the second embodiment, the sectional views being in the A-A' cross-section and C-C' cross-section of the sub-section (A) of FIG. 5. Sectional views in the B-B' cross-section of the sub-section (A) of FIG. 5 is the same as FIG. 4. The embodiment of this manufacturing method is explained with reference to FIG. 4 through FIG. 6.

(1) The field oxide film 3 for unit separation is formed on the P substrate 1 by the usual LOCOS method. The sacrifice oxide film 23 is formed on the active region surface demarcated by the field oxide film 3, and a channel dope injection is performed. A poly silicon film is deposited on the P substrate 1. Further, on the poly silicon film, a laminating film 30 that consists of a silicon oxide film that is 100-200A thick, and a silicon nitride film that is 100-150A is formed. By the phototype process technology and the etching technology, the laminating film 30 is formed on the field oxide film 3 that is formed on the control gate 15 (refer to sub-section (a) of FIG. 4 and sub-section (a) of FIG. 6).

(2) The poly silicon oxide film sidewall 33 is formed on the side of the control gate 15, thickness of which is between 150A and 250A, by a heat oxidization process. At this time, a silicon oxide film that is 5-50A thick is formed on the upper surface of the silicon nitride film of the laminating film 30 by re-oxidization of the silicon nitride film, thereby the laminating film 31 consisting of a three-layer film of silicon oxide film/silicon nitride film/silicon oxide film is formed. Simultaneously, the sacrifice oxide film 23 grows, and becomes the silicon oxide film 25 (refer to sub-section (b) of FIG. 4 and sub-section (b) of FIG. 6).

(3) Like the process explained with reference to the sub-section (c) of FIG. 3 and the sub-section (c) of FIG. 4, the resist pattern 27 is formed, and the silicon oxide film 25 of the low voltage transistor region is selectively removed (refer to sub-section (c) FIG. 4 and sub-section (c) of FIG. 6).

(4) Like the process explained with reference to the sub-section (d) of FIG. 3 and the sub-section (d) of FIG. 4, a heat oxidization process is performed, after removing the resist pattern 27, thereby the gate oxide film 19 for the memory is formed in the memory unit region, and the high voltage endurance gate oxide film 11 is formed in the high-voltage transistor region, and then, the poly silicon film 29 is deposited (refer to sub-section (d) of FIG. 4 and sub-section (d) of FIG. 6).

(5) The selection gate 13 and the floating gate 21 are formed from the poly silicon film 29 by the phototype process technology and the etching technology like the process explained with reference to FIG. 1. Then, the N type diffusion layers 5, 7, and 9 are formed by the ion implantation (refer to FIG. 5).

According to this embodiment, the insulation films of the upper surface and the side of the control gate 15 can take a different type, or different film thickness, or both. This increases the degree of freedom in raising the coupling ratio, and provides a wider choice of processes that can be selected.

In this embodiment, the gate oxide film 19 for the memory may be formed after selectively removing the silicon oxide film of the memory region, after forming the poly silicon oxide film sidewall 33 and the gate oxide film 25 of the high-voltage transistor region by the heat oxidization, after removing the sacrifice oxide film 23. In this case, the gate oxide film of the high-voltage transistor region is a twice-oxidized film, therefore, thickness variation can be suppressed, and reliability can be raised.

Further, although the poly silicon oxide film sidewall 33 is formed by heat oxidization, an HTO film (high temperature oxide film) sidewall may be formed by depositing an HTO film in the state shown by the sub-section (a) of FIG. 6, and by etching-back. However, since the gate oxide film 23 for the memory of the active region surface of the high-voltage transistor region and the low voltage transistor region is also removed by the etching-back, a heat oxidization process is necessary such that a silicon oxide film to be used as a predecessor of the high voltage endurance gate oxide film is formed.

FIG. 7 shows the third embodiment of the semiconductor device. A plan view is shown at sub-section (A). Sub-section (B) shows a sectional view in the A-A' cross-section, sub-section (C) shows a sectional view in the B-B' cross-section, and sub-section (D) shows a sectional views in the C-C' cross-section of the sub-section (A). Although this embodiment describes only one memory unit, the embodiment is applicable to any number of memory units. This embodiment is explained with reference to FIG. 7. The same numerals are given to the portion that achieves the same function as in the first embodiment shown in FIG. 1, and detailed explanation of the portion is not repeated.

The field oxide film 3 is formed on the surface of the P substrate 1, and the N type diffusion layers 5, 7, and 9 are formed in the active region of the P substrate 1. The selection gate 13 is formed through the high voltage endurance gate oxide film 11 on the P substrate 1 that includes the interval region between the N type diffusion layers 5 and 7.

The control gate 15 is formed on the field oxide film 3 of the memory unit region, and the inter-layer silicon oxide film 17 is formed on the surface of the control gate 15. The gate oxide film 19 for the memory is formed on the surface of the P substrate 1 that includes the interval region between the N type diffusion layers 7 and 9. The floating gate 21 is formed on the inter-layer silicon oxide film 17, the field oxide film 3, and the gate oxide film 19 for the memory.

A poly silicon film 35 having the same film thickness as the control gate 15 is formed on the field oxide film 3. A silicon oxide film 37 (illustration is omitted in sub-section (A)) having the same film thickness as the inter-layer silicon oxide film 17 is formed on the surface of the poly silicon film 35. A poly silicon film 39 having the same film thickness as the floating gate 21 is formed on the silicon oxide film 37. The poly silicon film 35, the silicon oxide film 37, and the poly silicon film 39 make up a capacitor.

FIG. 8 shows sectional views for explaining the third embodiment of the manufacturing method for manufacturing the semiconductor device of the third embodiment, which are in the A-A' cross-section and the C-C' cross-section of the sub-section (A) of FIG. 7. The embodiment of this manufacturing method is explained with reference to FIG. 4, FIG. 7, and FIG. 8.

(1) The field oxide film 3 for unit separation is formed on the P substrate 1 by the usual LOCOS method, the sacrifice oxide film 23 is formed, and a channel dope injection is performed. Then, a poly silicon film that is 2500-4500A thick is formed on the P substrate 1. By the phototype process technology and the etching technology, the control gate 15 and the poly silicon film 35 serving as the lower layer of the capacitor are formed on the field oxide film 3 (refer to the sub-section (a) of FIG. 4 and sub-section (a) of FIG. 8).

(2) The inter-layer silicon oxide film 17 and an inter-layer silicon oxide film 37 are formed on the surface of the control gate 15 and on the surface of the poly silicon film 35, respectively, in 150-250A film thickness by a heat oxidization process. Simultaneously, the sacrifice oxide film 23 grows, and becomes the silicon oxide film 25 (refer to the sub-section (b) of FIG. 4 and sub-section (b) of FIG. 8).

(3) A resist pattern 41 is formed such that the control gate 15, the poly silicon film 35, and the silicon oxide film 25 of the high-voltage transistor region are covered, and the silicon oxide film 25 of the low voltage transistor region is selectively removed (refer to the sub-section (c) of FIG. 4 and sub-section (c) of FIG. 8).

(4) Like the process explained with reference to the sub-section (d) of FIG. 3 and the sub-section (d) of FIG. 4, the resist pattern 41 is removed, the gate oxide film 19 for the memory is formed in the memory unit region by a heat oxidization process, the high voltage endurance gate oxide film 11 is formed by growing the silicon oxide film 25 of the high-voltage transistor region, and then, the poly silicon film 29 is deposited all over the upper surface of the P substrate 1 (refer to the sub-section (d) of FIG. 4 and sub-section (d) of FIG. 8).

(5) From the poly silicon film 29, the selection gate 13, the floating gate 21, and the poly silicon film 39 serving as the upper layer of the capacitor on the silicon oxide film 37 are formed by the phototype process technology and the etching technology. Thereby, the capacitor structured by the poly silicon film 35, the silicon oxide film 37, and the poly silicon film 39 is formed simultaneously.

Then, the N type diffusion layers 5, 7, and 9 are formed by the ion implantation (refer to FIG. 7).

In this embodiment, although the silicon oxide film 37 is used as an insulation film between the poly silicon films 35 and 39 of the capacitor, the capacitor can also be formed by laminating a silicon oxide film, a silicon nitride film, and a silicon oxide film, like the manufacturing method explained with reference to FIG. 6.

FIG. 9 shows the fourth embodiment of the semiconductor device. Sub-section (A) shows a plan view. Sub-section (B) shows a sectional view in the A-A' cross-section, sub-section (C) shows a sectional view in the B-B' cross-section, and sub-section (D) shows a sectional views in the C-C' cross-section of the sub-section (A). Although this embodiment describes only one memory unit, the embodiment is applicable to any number of memory units. This embodiment is explained with reference to FIG. 9. The same numerals are given to the portion that achieves the same function as in the first embodiment shown in FIG. 1, and detailed explanation of the portion is not repeated.

Points of this embodiment, which are different from the first embodiment are that the selection gate 14 is formed by the poly silicon film that is formed simultaneously with the control gate 15, that the high voltage endurance gate oxide film 12 for the high-voltage transistor made of the once-oxidized film is formed under the selection gate 14, and that silicon oxide film 18 is formed on the surface of the selection gate 14. Film thickness of the high voltage endurance gate oxide film 12 is between 400A and 600A. Here, in this embodiment, it is 500A. Film thickness of the selection gate 14 is between 2500A and 4500A. Here, in this embodiment, it is 3500A. Film thickness of the silicon oxide film 18 is between 150A and 250A. Here, in this embodiment, it is 200A. Illustration of the silicon oxide film 18 is omitted in the sub-section (A) of FIG. 9.

FIG. 10 and FIG. 11 show sectional views for explaining the fourth embodiment of the manufacturing method for manufacturing the semiconductor device of the fourth embodiment. FIG. 10 shows sectional views that show sectional views in the A-A' cross-section and the C-C' cross-section of the sub-section (A) of FIG. 9. FIG. 11 shows sectional views in the B-B' cross-section of the sub-section (A) of FIG. 9. The embodiment of this manufacturing method is explained with reference to FIG. 9 through FIG. 11.

(1) The field oxide film 3 for unit separation is formed on the P substrate 1 by the usual LOCOS method. A sacrifice oxide film is formed in film thickness between 250A and 400A on the surface of the active region demarcated by the field oxide film 3, and a channel dope injection is performed. After removing the sacrifice oxide film, a heat oxidization process is performed such that the high voltage endurance gate oxide film 12 in film thickness between 400A and 600A is formed in the active region. A poly silicon film having a thickness between 2500A and 4500A is deposited all over the upper surface of the P substrate 1. By the phototype process technology and the etching technology, the control gate 15 is formed on the field oxide film 3 of the memory unit formation region, and the selection gate 14 is formed on the high voltage endurance gate oxide film 12 of the high-voltage transistor formation region and the field oxide film 3 (refer to sub-section (a) of FIG. 10 and sub-section (a) of FIG. 11).

(2) The silicon oxide film 18 is formed on the surface of the selection gate 14 in film thickness, for example, between 150A and 250A by a heat oxidization process, and the inter-layer silicon oxide film 17 is formed on the surface of the control gate 15. At this time, film thickness of the high voltage endurance gate oxide film 12 of the memory unit region grows, and it becomes the silicon oxide film 43 (refer to sub-section (b) of FIG. 10 and sub-section (b) of FIG. 11).

(3) A resist pattern 45 is formed such that the selection gate 14 and the control gate 15 are covered, and the silicon oxide film 43 of the memory unit region is selectively removed (refer to sub-section (c) of FIG. 10 and sub-section (c) of FIG. 11).

(4) The gate oxide film 19 for the memory is formed on the surface of the P substrate 1 of the memory unit region by a heat oxidization process, after removing the resist pattern 45. Then, the poly silicon film 29 is deposited (refer to sub-section (d) of FIG. 10 and sub-section (d) of FIG. 11).

(5) The floating gate 21 is formed on the gate oxide film 19 for the memory, on the field oxide film 3, and on the control gate 15 from the poly silicon film 29 by the phototype process technology and the etching technology. Although not shown in the figure, at this time, a gate electrode of a transistor that makes up a peripheral circuit can simultaneously be formed from the poly silicon film 29. Then, the N type diffusion layers 5, 7, and 9 are formed on the P substrate 1, using the selection gate 14 and the floating gate 21 as a mask by the ion implantation under a condition of, for example, injecting energy being 70 KeV and a dose amount of phosphor or arsenic being $6 \times 10^{15}/cm^2$ (refer to FIG. 9).

In this embodiment, since the high voltage endurance gate oxide film 12 for the high-voltage transistor and the gate oxide film 19 for the memory are formed separately, each of the gate oxide films can take a different film thickness by one heat oxidization process. In this manner, the resist pattern does not remain during formation of the high voltage endurance gate oxide film 12, as was the case with the conventional method for forming the high voltage endurance gate oxide film for the high-voltage transistor, which was explained using FIG. 30. In this manner, quality of the high voltage endurance gate oxide film for the high-voltage transistor is enhanced.

In this embodiment, the inter-layer silicon oxide film 17 on the control gate 15, the poly silicon oxide film 18 on the selection gate 14, and the gate oxide film 19 for the memory can be simultaneously formed after forming the selection gate 14 and entirely removing the oxide film in the active region. In this manner, the problem that the P substrate 1 is exposed at the gate oxide film 19 formation region for the memory during resist pattern removal like the conventional technology is solved.

Further, since the high voltage endurance gate oxide film 12 is already covered by the selection gate 14 when the gate oxide film 19 for the memory is formed (refer to (4) above), it is not influenced by a heat oxidization process in a later step. Thereby, the uniformity of the film thickness of the high voltage endurance gate oxide film 12 for the high-voltage transistor can be obtained, and film thickness controlling is also facilitated.

Further, although the high voltage endurance gate oxide film 12 for the high-voltage transistor is formed on the surface of the active region of the P substrate 1, and the poly silicon film serving as the selection gate 14 is formed on it in this embodiment by the process described in (1) above with reference to the sub-section (a) of FIG. 10 and the sub-section (a) of FIG. 11, the present invention is not limited to this. The gate electrode for the low voltage transistor may be formed on the gate oxide film for the low voltage transistor whose film thickness is between 125A and 250A. In this manner, the gate oxide film for the low voltage transistor can be formed by the once-oxidized film, which suppresses film thickness variation, and improves the reliability.

Further, although the insulation film between the control gate 15 and the floating gate 21 is served by the inter-layer silicon oxide film 17 in this embodiment, the present invention is not limited to this. For example, the insulation film between the upper surface of the control gate 15 and the floating gate 21 may be served by a laminating film of silicon oxide film/silicon nitride film/silicon oxide film, like the manufacturing method explained with reference to FIG. 6.

Further, like the manufacturing method explained with reference to FIG. 8, a capacitor pattern may be formed simultaneously, which consists of a lower layer of a poly silicon film that is formed simultaneously with the control gate 15, and an upper layer of a poly silicon film that is formed simultaneously with the floating gate 21.

FIG. 12 shows the fifth embodiment of the semiconductor device. Sub-section (A) shows a plan view. Sub-section (B) shows a sectional view in the A-A' cross-section, sub-section (C) shows a sectional view in the B-B' cross-section, and sub-section (D) shows a sectional views in the C-C' cross-section of the sub-section (A). Although this embodiment describes only one memory unit, the embodiment is applicable to any number of memory units. This embodiment is explained with reference to FIG. 12. The same numerals are given to the portion that achieves the same function as the fourth embodiment shown in FIG. 9, and detailed explanation of the portion is not repeated.

The field oxide film 3 is formed on the surface of the P substrate 1. An N type embedded diffusion layer 47 is formed in a region that includes the active region of the P substrate 1 surrounded by the field oxide film 3. N type diffusion layers 49 and 51 are formed on both sides of the embedded diffusion layer 47. In the active region of the P substrate 1, the N type diffusion layer 5 and the N type diffusion layer 49 are formed with an interval, and the N type diffusion layer 9 and the N type diffusion layer 51 are formed with an interval.

On the P substrate 1 that includes the interval region between the N type diffusion layers 5 and 49, the selection gate 14 is formed through the high voltage endurance gate oxide film 12, overlapping in part with the N type diffusion layers 5 and 49. The silicon oxide film 18 (illustration is omitted in sub-section (A) of FIG. 12) is formed on the surface of the selection gate 14.

The control gate 15 is formed on the field oxide film 3 of the memory unit region, and the inter-layer silicon oxide film 17 (illustration is omitted in the sub-section (A) of FIG. 12) is formed on the surface of the control gate 15. On the surface of the P substrate 1 that includes the interval region between the N type diffusion layers 9 and 51, the gate oxide film 19 for the memory is formed, overlapping in part with the N type diffusion layers 9 and 51.

A tunnel oxide film 53 that serves as a path for an electric charge at the time of writing to and erasing the memory is formed in a part of the surface of the embedded diffusion layer 47 in film thickness between 90A and 100A. Here, in this embodiment, the thickness is 90A. Around the circumference of the tunnel oxide film 53 on the surface of the embedded diffusion layer 47, a silicon oxide film 55 is formed simultaneously with the gate oxide film 19.

A floating gate 57 is formed on the inter-layer silicon oxide film 17, the field oxide film 3, and the gate oxide film 19 for the memory. A part of the floating gate 57 is formed also on the tunnel oxide film 53 and the silicon oxide film 55.

In the fifth embodiment of the semiconductor device, since the tunnel oxide film 53 with film thickness thinner than the gate oxide film 19 for the memory is formed, writing to and erasing the memory can be performed through the tunnel oxide film 53, and the flexibility in designing the memory characteristic is enhanced.

FIG. 13 and FIG. 14 show sectional views for explaining the fifth embodiment of the manufacturing method for manufacturing the semiconductor device of the fifth embodiment. FIG. 13 shows the sectional view in the A-A' cross-section and in the C-C' cross-section of the sub-section (A) of FIG. 12, and FIG. 14 shows the sectional view in the B-B' cross-section of the sub-section (A) of FIG. 12. The embodiment of this manufacturing method is explained with reference to FIG. 12 through FIG. 14.

(1) The field oxide film 3 for unit separation is formed on the P substrate 1 by the usual LOCOS method. A sacrifice oxide film in film thickness between 250A and 400A is formed on the surface of the active region demarcated by the field oxide film 3. The diffusion layer 47 is formed by the ion implantation using phosphor under a condition, e.g., 80 KeV and a dosing amount of $8 \times 10^{15}/cm^2$, around the tunnel oxide film region of the P substrate 1, and then, a channel dope injection is performed. After removing the sacrifice oxide film, the high voltage endurance gate oxide film 12 is formed in film thickness between 400A and 600A in the active region by a heat oxidization process. A poly silicon film that is 2500-4500A thick is deposited all over the upper surface of the P substrate 1. The control gate 15 is formed on the field oxide film 3 of the memory unit formation region by the phototype process technology and the etching technology, and the selection gate 14 is formed on the high voltage endurance gate oxide film 12 of the high-voltage transistor formation region, and on the field oxide film 3 (refer to sub-section (a) of FIG. 13 and sub-section (a) of FIG. 14).

(2) A silicon oxide film 16 is formed in film thickness, e.g., between 150A and 250A by a heat oxidization process after completely removing the oxide film on the active region. The silicon oxide film 18 is simultaneously formed on the surface of the selection gate 14, and the inter-layer silicon oxide film 17 is formed on the surface of the control gate 15 (refer to sub-section (b) of FIG. 13 and sub-section (b) of FIG. 14).

(3) A resist pattern 46 that contains an opening only at the tunnel oxide film region is formed, and the silicon oxide film 16 in the tunnel oxide film region is selectively removed, using the resist pattern 46 as a mask (refer to sub-section (c) FIG. 13 and sub-section (c) of FIG. 14).

(4) After removing the resist pattern 46, a tunnel oxide film 53 in film thickness between 90A and 100A is formed in the memory unit region on the surface of the P substrate 1 by a heat oxidization process. At this time, the silicon oxide film 16 of the region around the tunnel oxide film region and other active region surfaces grows up to film thickness between, e.g., 250A and 350A, and turns into a silicon oxide film 55 and the gate oxide film 19 for the memory. Then, the poly silicon film 29 is deposited (refer to sub-section (d) of FIG. 13 and sub-section (d) of FIG. 14).

(5) The floating gate 57 is formed from the poly silicon film 29 by the phototype process technology and the etching technology on the gate oxide film 19 for the memory, on the silicon oxide film 55, on the tunnel oxide film 53, on the field oxide film 3, and on the control gate 15. Although not shown in the figure, a gate electrode of a transistor that constitutes a peripheral circuit can be simultaneously formed from the poly silicon film 29. Then, the N type diffusion layers 5, 9, 49, and 51 are formed on the P substrate 1 by the ion implantation of phosphor or arsenic, using the selection gate 14 and the floating gate 57 as a mask under a condition of, for example, injecting energy of 70 KeV and an dosing amount of $6 \times 10^{15}/cm^2$ (refer to FIG. 12).

In this embodiment, film thickness of each of the tunnel oxide film 53, the high voltage endurance gate oxide film 12, and the gate oxide film 19 for the memory can be set up freely. Further, since the tunnel oxide film 53 and the high voltage endurance gate oxide film 12 can be formed by the once-oxidized film, the reliability of each oxide film can be secured and film thickness variation can be controlled.

Further, although the inter-layer silicon oxide film 17 serves as the insulation film between the control gate 15 and the floating gate 57 in this embodiment, the present invention is not limited to this. For example, a laminating film of silicon oxide film/silicon nitride film/silicon oxide film may serve as the insulation film between the upper surface of the control gate 15 and the floating gate 57, like the manufacturing method explained with reference to FIG. 6.

Further, the capacitor pattern consisting of the lower layer of a poly silicon film formed simultaneously with the control gate 15, and the upper layer of a poly silicon film formed simultaneously with the floating gate 57 may be formed simultaneously, like the manufacturing method explained with reference to FIG. 8.

FIG. 15 shows the sixth embodiment of the semiconductor device. Sub-section (A) is a plan view. Sub-section (B) shows a sectional view in the A-A' cross-section, sub-section (C) shows a sectional view in the B-B' cross-section, and sub-section (D) shows a sectional view in the C-C' cross-section of the sub-section (A). Sub-section (E) shows a sectional view of a low voltage transistor formed in an area different from the sub-section (A), and is considered in D-D' cross-section. Although this embodiment describes only one memory unit, the embodiment is applicable to any number of memory units. This embodiment is explained with reference to FIG. 15. The same numerals are given to the portion that achieves the same function as the first embodiment shown in FIG. 1, and detailed explanation of the portion is not repeated.

The field oxide film 3 for unit separation is formed on the surface of the P substrate 1, and the N type diffusion layers 5, 7, and 9 are formed in the active region of the P substrate 1.

A high voltage endurance gate oxide film 61 in film thickness between 400A and 600A for the high-voltage transistor is formed, overlapping in part with the N type diffusion layers 5 and 7, on the surface of the P substrate 1 that includes the interval region between the N type diffusion layers 5 and 7. Here, in this embodiment, the film thickness is 500A. A selection gate 62 is formed from a poly silicon film in thickness between 2500A and 4500A on the high voltage endurance gate oxide film 61. Here, in this embodiment, the film thickness is 3500A. The N type diffusion layers 5 and 7, the high voltage endurance gate oxide film 61, and the selection gate 62 constitute the high-voltage transistor.

A gate oxide film 63 for the memory is formed in film thickness between 90A and 100A on the surface of the P substrate 1 that includes the interval region between N the type diffusion layers 7 and 9, overlapping in part with the N type diffusion layers 7 and 9. Here, in this embodiment, the film thickness is 90A. The gate oxide film 63 for the memory serves also as a tunnel oxide film.

On the memory unit region of the field oxide film 3, and on the gate oxide film 63 for the memory, a floating gate 65 of a poly silicon film is formed in film thickness between 2500A and 4500A. Here, in this embodiment, the film thickness is 3500A. On the surface of the floating gate 65, an inter-layer silicon oxide film (the second insulation film) 67 (illustration is omitted in sub-section (A) of FIG. 15) is formed in film thickness between 150A and 250A. Here, in this embodiment, the film thickness is 200A.

On the memory unit region of the field oxide film 3, and on the inter-layer silicon oxide film 67, a control gate 69 of a poly silicon film is formed in film thickness between 2500A and 4500A. Here, in this embodiment, the film thickness is 3500A.

A low voltage endurance gate oxide film 71 for a low voltage transistor is formed on the surface of the active region of the low voltage transistor region (illustration is omitted in the sub-section (A)) in film thickness between 125A and 150A. Here, in this embodiment, the film thickness is 150A. On the low voltage endurance gate oxide film 71, a gate electrode 73 for the low voltage transistor of a poly silicon film is formed in film thickness between 2500A and 4500A. Here, in this embodiment, the film thickness is 3500A (refer to (E)). Although illustration is omitted, N type diffusion layers are formed in the active region corresponding to the both ends of the gate electrode 73 for the low voltage transistor, the both ends being in the z-axis, that is, perpendicular through the paper.

In the memory unit of the sixth embodiment of the semiconductor device, the floating gate 65 and the control gate 69 of the poly silicon film can be widely overlapped with each other through the inter-layer silicon oxide film 67 on the field oxide film 3, thereby a large coupling ratio is obtained, making it possible to rewrite to the memory at a low voltage. Further, since the control gate 69 is formed with the poly silicon film, both positive and negative voltages can be applied to the control gate 69.

FIG. 16 and FIG. 17 show sectional views for explaining the sixth embodiment of the manufacturing method for manufacturing the semiconductor device of the sixth embodiment. FIG. 16 shows sectional views in the A-A' cross-section and the C-C' cross-section of the sub-section (A) of FIG. 15, and in the D-D' cross-section of the sub-section (E) of FIG. 15. Further, FIG. 17 shows sectional views in the B-B' cross-section of the sub-section (A) of FIG. 15. The embodiment of this manufacturing method is explained with reference to FIG. 15 through FIG. 17.

(1) The field oxide film 3 for unit separation is formed on the P substrate 1 by the usual LOCOS method. A sacrifice oxide film in thickness between 250A and 400A is formed on the surface of the active region demarcated by the field oxide film 3, and a channel dope injection is performed. After removing the sacrifice oxide film, a heat oxidization process is performed, and the gate oxide film 63 for the memory in thickness between 90A and 100A is formed in the active region. A poly silicon film is deposited in thickness between 2500A and 4500A all over the upper surface of the P substrate 1. By the phototype process technology and the etching technology, the floating gate 65 is formed on the field oxide film 3 in the memory unit region, and the gate oxide film 63 for the memory (refer to sub-section (a) of FIG. 16 and sub-section (a) of FIG. 17).

(2) An inter-layer silicon oxide film 67 in film thickness between 400A and 600A is formed on the surface of the floating gate 65 by a heat oxidization process. At this time, the gate oxide film 63 for the memory in the high-voltage transistor region and in the low voltage transistor region grows up to have film thickness between 200A and 300A, and turns into the silicon oxide film 75 (refer to sub-section (b) of FIG. 16 and sub-section (b) of FIG. 17).

(3) A resist pattern 77 that covers the floating gate 65 and the high-voltage transistor region of the silicon oxide film 75 is formed, and the silicon oxide film 75 in the low voltage transistor region is selectively removed (refer to sub-section (c) of FIG. 16 and sub-section (c) of FIG. 17).

(4) After removing the resist pattern 77, a low voltage endurance gate oxide film 71 in film thickness between 125A and 250A is formed in the memory unit region of the surface of the P substrate 1 by a heat oxidization process. At this time, the high-voltage transistor region of the silicon oxide film 75 grows up to have film thickness between 400A and 600A, and turns into a high voltage endurance gate oxide film 61. Then, a poly silicon film 79 is deposited in thickness between 2500A and 4500A all over the upper surface of the P substrate 1 (refer to section (d) of FIG. 16 and sub-section (d) of FIG. 17).

(5) A control gate 69 is formed in the memory unit region of the field oxide film 3 and the floating gate 65, a selection gate 62 is formed on the high voltage endurance gate oxide film 61, and a gate electrode 73 for the low voltage transistor is formed on the gate electrode 71 by patterning of the poly silicon film 79 by the phototype process technology and the etching technology. Then, the N type diffusion layers 5, 7, and 9 and an N type diffusion layer for the low voltage transistor are formed on the P substrate 1 by the ion implantation, using the selection gate 62, the floating gate 65, and the gate electrode 73 as a mask under conditions such as injecting energy of 70 KeV and a dosing amount of phosphor or arsenic of $6 \times 10^{15}/cm^2$ (refer to FIG. 15).

In this embodiment, since the gate oxide film (tunnel oxide film) 63 for the memory and the low voltage endurance gate oxide film 71 for the low voltage transistor are formed independently, each of the gate oxide films can take a different film thickness by one heat oxidization process. In this manner, even when the low voltage endurance gate oxide film 71 is thinner than the gate oxide film 63 for the memory, the reliability of both films can be secured, and film thickness variation can be controlled.

In this embodiment, the high voltage endurance gate oxide film 61 for the high-voltage transistor is formed by the heat oxidization of the silicon oxide film 75 that is formed by growing the gate oxide film 63 for the memory by the heat oxidization. However, the heat oxidization process for forming the silicon oxide film 75 serves also as formation of the inter-layer silicon oxide film 67. For this reason, if targeted film thickness of the silicon oxide films 67 is greatly different from the inter-layer oxide film 75, the silicon oxide film 75 of the high-voltage transistor region has to be once removed, and a new silicon oxide film has to be formed. In this case, an additional phototype process and an additional oxide film etching process are required for protecting either the inter-layer silicon oxide film 67 on the surface of the floating gate 65 or the silicon oxide film 75.

FIG. 18 shows the seventh embodiment of the semiconductor device. Sub-section (A) is a plan view. Sub-section (B) shows a sectional view in the A-A' cross-section, sub-section (C) shows a sectional view in the B-B' cross-section, and sub-section (D) shows a sectional view in the C-C' cross-section of the sub-section (A). Sub-section (E) shows a sectional view of a low voltage transistor formed in an area different from the sub-section (A). Here, in this embodiment, the cross-section of the sub-section (E) is defined as the D-D' cross-section. Although this embodiment describes only one memory unit, the embodiment is applicable to any number of memory units. This embodiment is explained with reference to FIG. 18. The same numerals are given to the portion that achieves the same function as in the sixth embodiment shown in FIG. 15, and detailed explanation of the portion is not repeated.

The field oxide film 3 is formed on the surface of the P substrate 1, and the N type diffusion layers 5, 7, and 9 are formed in the active region of the P substrate 1. The high voltage endurance gate oxide film 61 is formed on the surface of the P substrate 1 that includes the interval region between the N type diffusion layers 5 and 7. The selection gate 62 is formed on the high voltage endurance gate oxide film 61.

The gate oxide film 63 for the memory is formed on the surface of the P substrate 1 that includes the interval region between the N type diffusion layers 7 and 9. The floating gate 65 is formed on the memory unit region of the field oxide film 3, and the gate oxide film 63 for the memory.

A laminating film 81 (illustration is omitted in sub-section (A)) of silicon oxide film/silicon nitride film/silicon oxide film is formed on the upper surface of the floating gate 65. Film thickness of the silicon oxide film that constitutes the laminating film 81 is between 100A and 150A. Here, in this embodiment, it is 150A thick. Film thickness of the silicon nitride film is between 100A and 200A. Here, in this embodiment, it is 150A thick. On the side of the floating gate 65, a poly silicon oxide film sidewall 82 is formed in film thickness between 150A and 250A. Here, in this embodiment, it is 200A thick.

The laminating film 81 and the poly silicon oxide film sidewall 82 constitute the second insulation film of the semiconductor device of the present invention.

The control gate 69 is formed on the field oxide film 3 and the laminating film 81. The low voltage endurance gate oxide film 71 and the gate electrode 73 are formed (refer to (E)) in the low voltage transistor region (illustration is omitted in (A)). Although illustration is omitted, an N type diffusion layer is formed in the active region corresponding to both ends of the gate electrode 73 for the low voltage transistor, both ends being in the z-axis, that is, perpendicular through the paper.

For the memory unit of the seventh embodiment of the semiconductor device, the laminating film 81 is provided, which includes a silicon nitride film through which an electron cannot pass easily between the floating gate 65 and the control gate 69, so that the reliability of the memory is raised.

FIG. 19 shows sectional views for explaining the seventh embodiment of the manufacturing method for manufacturing the semiconductor device of the seventh embodiment, which are in the A-A' cross-section and the C-C' cross-section of the sub-section (A) of FIG. 18, and in the D-D' cross-section of the sub-section (E) of FIG. 18. The sectional views in the B-B' cross-section of sub-section (A) of FIG. 18 is the same as FIG. 17. The embodiment of this manufacturing method is explained with reference to FIG. 17 through FIG. 19.

(1) The field oxide film 3 for unit separation is formed on the P substrate 1 by the usual LOCOS method. A sacrifice oxide film is formed on the surface of the active region demarcated by the field oxide film 3, and a channel dope injection is performed. After removing the sacrifice oxide film, a heat oxidization process is performed and the gate oxide film 63 for the memory is formed on the surface of the active region. A poly silicon film is deposited all over the upper surface of the P substrate 1, on which a laminating film 80 that includes a silicon nitride film in thickness between 100A and 200A and a silicon oxide film in thickness between 100A and 150A is formed. By the phototype process technology and the etching technology, the floating gate 65 is formed on the memory unit region of the field oxide film 3, and on the gate oxide film 63 for the memory, and the laminating film 80 is formed on the upper surface of the floating gate 65 (refer to sub-section (a) FIG. 17 and sub-section (a) of FIG. 19).

(2) A poly silicon oxide film sidewall 82 in film thickness between 150A and 250A is formed on the side of the floating gate 65 by a heat oxidization process. At this time, the silicon nitride film of the laminating film 80 is oxidized again, forming a silicon oxide film which is 5-50A thick, resulting in the laminating film 81 of a three-layer film consisting of silicon oxide film/silicon nitride film/silicon oxide film formed on the upper surface of the silicon nitride film. Simultaneously, the gate oxide film 63 for the memory in the high-voltage transistor region and the low voltage transistor region grows, and becomes the silicon oxide film 75 (refer to sub-section (b) of FIG. 17 and sub-section (b) of FIG. 19).

(3) Like the process explained with reference to the sub-section (c) of FIG. 16 and the sub-section (c) of FIG. 17, a resist pattern 77 is formed, and the low voltage transistor region of the silicon oxide film 75 is removed (refer to sub-section (c) of FIG. 17 and sub-section (c) of FIG. 19).

(4) Like the process explained with reference to the sub-section (d) of FIG. 16 and the sub-section (d) of FIG. 17, the resist pattern 77 is removed, and then, a heat oxidization process is performed such that the low voltage endurance gate oxide film 71 is formed on the surface of the active region of the low voltage transistor region. The high voltage endurance gate oxide film 61 is formed in the high-voltage transistor region, and the poly silicon film 79 is deposited after that (refer to sub-section (d) of FIG. 17 and sub-section (d) of FIG. 19).

(5) Like the process explained with reference to FIG. 15, the selection gate 62, the control gate 69, and the gate electrode 73 for the low voltage transistor are formed from the poly silicon film 79 by the phototype process technology and the etching technology. Then, the N type diffusion layers 5, 7, and 9 and an N type diffusion layer for the low voltage transistor are formed by the ion implantation (refer to FIG. 18).

In this embodiment, the high voltage endurance gate oxide film 61 for the high-voltage transistor is formed by heat oxidization of the silicon oxide film 75 that was made by growing the gate oxide film 63 for the memory by heat oxidization. Here, the heat oxidization process that forms the silicon oxide film 75 serves as formation of the poly silicon oxide film sidewall 82. When targeted film thickness of the silicon oxide film 75 in the heat oxidization process differs greatly from the film thickness target of the poly silicon oxide film sidewall 82, a phototype process and an oxide film etching process are added for protecting the laminating film 81 of the surface of the floating gate 65 and the poly silicon oxide film sidewall 82, the silicon oxide film 75 is selectively removed and heat oxidization is performed again such that the silicon oxide film having desired film thickness is formed in the high-voltage transistor region.

Further, although the poly silicon oxide film sidewall 82 is formed by heat oxidization in this embodiment, an HTO film sidewall may be formed by etching-back an HTO film that is deposited in the state of FIG. 19 (a). However, since the gate oxide film 63 for the memory of the active region surface in the high-voltage transistor region and the low voltage transistor region is also removed by etching-back, a heat oxidization process is necessary such that a silicon oxide film used as the predecessor of the high voltage endurance gate oxide film is formed.

FIG. 20 shows the eighth embodiment of the semiconductor device. Sub-section (A) is a plan view. Sub-section (B) shows a sectional view in the A-A' cross-section, sub-section (C) shows a sectional view in the B-B' cross-section, and sub-section (D) shows a sectional view in the C-C' cross-section of the sub-section (A). Sub-section (E) shows a sectional view of a low voltage transistor formed in an area different from the sub-section (A). The cross-section of the sub-section (E) is called the D-D' cross-section. Although this embodiment describes only one memory unit, the embodiment is applicable to any number of memory units. This embodiment is explained with reference to FIG. 20. The same numerals are given to the portion that achieves the same function as in the sixth embodiment shown in FIG. 15, and detailed explanation of the portion is not repeated.

The field oxide film 3 is formed on the surface of the P substrate 1, and the N type diffusion layers 5, 7, and 9 are formed in the active region of the P substrate 1 of the memory unit region. The selection gate 62 is formed through the high voltage endurance gate oxide film 61 on the P substrate 1 that includes the interval region between the N type diffusion layers 5 and 7.

The gate oxide film 63 for the memory is formed on the surface of the P substrate 1 that includes the interval region between the N type diffusion layers 7 and 9. The floating gate 65 is formed on the field oxide film 3 of the memory unit region, and the gate oxide film 63 for the memory. The inter-layer silicon oxide film 67 is formed on the surface of the floating gate 65. The control gate 69 is formed on the field oxide film 3 and the inter-layer silicon oxide film 67. The low voltage endurance gate oxide film 71 and the gate electrode 73 are formed in the low voltage transistor region (illustration is omitted in sub-section (A)) (refer to sub-section (E)).

A poly silicon film 83 having the same film thickness as the floating gate 65 is formed on the field oxide film 3. A silicon oxide film 84 having the same film thickness as the inter-layer silicon oxide film 67 is formed on the surface of the poly silicon film 83. A poly silicon film 85 having the same film thickness as the control gate 69 is formed on the silicon oxide film 84. The poly silicon film 83, the silicon oxide film 84, and the poly silicon film 85 constitute a capacitor.

FIG. 21 shows sectional views for explaining the eighth embodiment of the manufacturing method for manufacturing the semiconductor device of the eighth embodiment, the sectional views being in the A-A' cross-section and the C-C' cross-section of the sub-section (A) of FIG. 20, and in the D-D' cross-section of the sub-section (E) of FIG. 20. The sectional view in the B-B' cross-section of the sub-section (A) of FIG. 20 is the same as that of FIG. 17. The embodiment of this manufacturing method is explained with reference to FIG. 17, FIG. 20, and FIG. 21.

(1) The field oxide film 3 for unit separation is formed on the P substrate 1 by the usual LOCOS method. A sacrifice oxide film is formed on the surface of the active region demarcated by the field oxide film 3, and a channel dope injection is performed. After removing the sacrifice oxide film, a heat oxidization process is performed such that the gate oxide film 63 for the memory is formed on the surface of the active region. A poly silicon film in thickness between 2500A and 4500A is deposited all over the upper surface of the P substrate 1. With the phototype process technology and the etching technology, the floating gate 65 is formed on the memory unit region of the field oxide film 3, and on the gate oxide film 63 for the memory. The poly silicon film 83 serving as the lower layer of the capacitor is formed on the field oxide film 3 (refer to sub-section (a) of FIG. 17 and sub-section (a) of FIG. 21).

(2) The inter-layer silicon oxide films 67 and 84 in thickness between 150A and 250A are formed on the surface of the floating gate 65 and on the surface of the poly silicon film 83, respectively, by a heat oxidization process. The gate oxide film 63 for the memory in the high-voltage transistor region and the low voltage transistor region grows, and becomes the silicon oxide film 75 (refer to sub-section (b) of FIG. 17 and sub-section (b) of FIG. 21).

(3) A resist pattern 86 is formed such that the floating gate 65, the poly silicon film 83, and the silicon oxide film 75 in the high-voltage transistor region are covered, and the silicon oxide film 75 of the low voltage transistor region is selectively removed (refer to sub-section (c) of FIG. 17 and sub-section (c) of FIG. 21).

(4) Like the process explained with reference to the sub-section (d) of FIG. 16 and the sub-section (d) of FIG. 17, after removing the resist pattern 86, a heat oxidization process is performed such that the low voltage endurance gate oxide film 71 is formed on the surface of the active region in the low voltage transistor region. The silicon oxide film 75 of the high-voltage transistor region is grown, forming the high voltage endurance gate oxide film 61, and then, the poly silicon film 79 is deposited all over the upper surface of the P substrate 1 (refer to sub-section (d) FIG. 17 and sub-section (d) of FIG. 21).

(5) The poly silicon film 85 serving as the upper layer of the capacitor is formed from the poly silicon film 79 on the selection gate 62, on the control gate 69, and on the silicon oxide film 84 by the phototype process technology and the etching technology. Thereby, the capacitor consisting of the poly silicon film 83, the silicon oxide film 84, and the poly silicon film 85 is formed simultaneously. Then, the N type diffusion layers 5, 7, and 9 and an N type diffusion layer for the low voltage transistor are formed by the ion implantation (refer to FIG. 20).

In this embodiment, although the silicon oxide film 84 serves as the insulation film between the poly silicon films 83 and 85 of the capacitor, a laminating film consisting of silicon oxide film/silicon nitride film/silicon oxide film may serve the purpose, like the manufacturing method explained with reference to FIG. 19.

FIG. 22 shows the ninth embodiment of the semiconductor device. Sub-section (A) is a plan view. Sub-section (B) shows a sectional view in the A-A' cross-section, sub-section (C) shows a sectional view in the B-B' cross-section, and sub-section (D) shows a sectional view in the C-C' cross-section of the sub-section (A). Sub-section (E) shows a sectional view of the low voltage transistor formed in an area different from the sub-section (A). The cross-section of the sub-section (E) is named the D-D' cross-section. Although this embodiment describes only one memory unit, the embodiment is applicable to any number of memory units. This embodiment is explained with reference to FIG. 22. The same numerals are given to the portion that achieves the same function as in the fifth embodiment shown in FIG. 12 and the sixth embodiment shown in FIG. 15, and detailed explanation of the portion is not repeated.

The field oxide film 3 is formed on the surface of the P substrate 1. The N type embedded diffusion layer 47 is formed in the region including the active region of the P substrate 1 surrounded by the field oxide film 3. The N type diffusion layers 49 and 51 are formed on the both sides of the embedded diffusion layer 47. The N type diffusion layer 5 and the N type diffusion layer 49 are formed with an interval, and the N type diffusion layer 9 and the N type diffusion layer 51 are formed with an interval in the active region of the P substrate 1.

A gate oxide film 87 for the memory in thickness between 200A and 300A is formed on the surface of the P substrate 1 that includes the interval region between the N type diffusion layers 9 and 51, overlapping in part with the N type diffusion layers 9 and 51. Here, in this embodiment, the thickness is 250A.

The tunnel oxide film 53 is formed in a part of the surface of the embedded diffusion layer 47. A silicon oxide film 88 is formed simultaneously with the gate oxide film 87 for the memory around the tunnel oxide film 53 on the surface of the embedded diffusion layer 47.

A floating gate 89 is formed on the memory unit region of the field oxide film 3, and the gate oxide film 87 for the memory. A part of a floating gate 89 is formed also on the tunnel oxide film 53 and the silicon oxide film 88. A silicon oxide film (second insulation film) 90 is formed on the surface of the floating gate 89. The control gate 69 is formed on the field oxide film 3 and the silicon oxide film 90.

The selection gate 62 is formed through the high voltage endurance gate oxide film 61 on the P substrate 1 that includes the interval region between the N type diffusion layers 5 and 49, overlapping in part with the N type diffusion layers 5 and 49. The low voltage endurance gate oxide film 71 and the gate electrode 73 (refer to sub-section (E)) are formed in the low voltage transistor region (illustration is omitted in sub-section (A)).

In the ninth embodiment of the semiconductor device, since the tunnel oxide film 53 is formed in thickness that is thinner than the gate oxide film 87 for the memory, the writing and erasing of the memory is performed through the tunnel oxide film 53, and the flexibility in designing the memory properties is raised.

FIG. 23 and FIG. 24 show sectional views for explaining the ninth embodiment of the manufacturing method for manufacturing the semiconductor device of the ninth embodiment. FIG. 23 shows sectional views in the A-A' cross-section and the C-C' cross-section of the sub-section (A) of FIG. 22, and in the D-D' cross-section of the sub-section (E) of FIG. 22. Further, FIG. 24 shows sectional views in the B-B' cross-section of the sub-section (A) of FIG. 22. This manufacturing method is explained with reference to FIG. 22 through FIG. 24.

(1) The field oxide film 3 for unit separation is formed on the P substrate 1 by the usual LOCOS method. By the ion implantation, e.g., at 80 KeV and with a dosing amount of phosphor of $8 \times 10^{15}/cm^2$, the embedded diffusion layer 47 is formed around the tunnel oxide film region of the P substrate 1. A sacrifice oxide film is formed on the surface of the active region demarcated by the field oxide film 3, and a channel dope injection is performed. After removing the sacrifice oxide film, a heat oxidization process is performed such that a silicon oxide film 91 in thickness between 150A and 250A is formed in the active region. A resist pattern 92 that has an opening only in the tunnel oxide film region is formed, and the silicon oxide film 91 at the tunnel oxide film region is selectively removed, using the resist pattern 92 as a mask (refer to sub-section (a) of FIG. 23 and sub-section (a) of FIG. 24).

(2) The tunnel oxide film 53 in thickness between 90A and 100A is formed in the tunnel oxide film region on the surface of the P substrate 1 by a heat oxidization process, after removing the resist pattern 92. At this time, the silicon oxide film 91 in the region around the tunnel oxide film region and other active region surfaces grows up to have 250-350A film thickness, and turns into the silicon oxide film 88 and the gate oxide film 87 for the memory.

A poly silicon film is deposited all over the P substrate 1. The floating gate 89 is formed on the memory unit region of the gate oxide film 87 of the memory, the field oxide film 3, the silicon oxide film 88, and the tunnel oxide film 53 by the phototype process technology and the etching technology (refer to sub-section (b) of FIG. 23 and sub-section (b) of FIG. 24).

(3) The silicon oxide film 90 in thickness between 150A and 250A is formed on the surface of the floating gate 89 by a heat oxidization process. At this time, the gate oxide film 87 for the memory in the high-voltage transistor region and the low voltage transistor region grows to become a silicon oxide film 93 that is 350-450A thick (refer to sub-section (c) of FIG. 23 and sub-section (c) of FIG. 24).

(4) A resist pattern 94 is formed such that the floating gate 89 is covered, and the silicon oxide film 93 of the active region surface in the high-voltage transistor region and the low voltage transistor region is selectively removed (refer to sub-section (d) of FIG. 23 and sub-section (d) of FIG. 24).

(5) A silicon oxide film 95 is formed on the surface of the active region of the high-voltage transistor region and the low voltage transistor region in thickness between 350A and 450A by a heat oxidization process, after removing the resist pattern 94. The resist pattern 77 is formed such that it has an opening in the low voltage transistor region, and the silicon oxide film 95 in the active region surface of the low voltage transistor region is selectively removed (refer to sub-section (e) of FIG. 23 and sub-section (e) of FIG. 24).

(6) Like the process explained with reference to the sub-section (d) of FIG. 16 and the sub-section (d) of FIG. 17, the low voltage endurance gate oxide film 71 is formed on the surface of the active region of the low voltage transistor region, and the high voltage endurance gate oxide film 61 is formed in the high-voltage transistor region by a heat oxidization process after removing the resist pattern 77, and then, a poly silicon film is deposited. Like the process explained with reference to FIG. 15, the selection gate 62, the control gate 69, and the gate electrode 73 for the low voltage transistor are formed by the phototype process technology and the etching technology. Then, the N type diffusion layers 5, 9, 49, and 51 and an N type diffusion layer for the low voltage transistor are formed by the ion implantation (refer to FIG. 22).

In this embodiment, film thickness of each of the tunnel oxide film 53, the high voltage endurance gate oxide film 61, the low voltage endurance gate oxide film 71, and the gate oxide film 87 for the memory can be set up freely. Further, since the tunnel oxide film 53 and the low voltage endurance gate oxide film 71 are formed by the once-oxidized film, and the high voltage endurance gate oxide film 61 and the gate oxide film 87 for the memory are formed by the twice-oxidized film, the reliability of each oxide film is secured and the control of film thickness variation is facilitated.

Although the insulation film between the control gate 69 and the floating gate 89 is formed by the silicon oxide film 90 in this embodiment, the present invention is not limited to this. For example, the insulation film between the upper surface of the floating gate 89 and the control gate 69 may be formed by a laminating film of silicon oxide film/silicon nitride film/silicon oxide film, like the manufacturing method explained with reference to FIG. 19. In this case, influence upon the capacitance between the floating gate and the control gate by oxidization processing at a later process is decreased, which enhances properties of the memory.

Further, the capacitor pattern that consists of a lower layer of a poly silicon film formed simultaneously with the floating gate 89, and an upper layer of a poly silicon film formed simultaneously with the control gate 69, like the manufacturing method explained with reference to FIG. 21, may be formed simultaneously.

FIG. 25 shows the tenth embodiment of the semiconductor device. Sub-section (A) is a plan view. Sub-section (B) shows a sectional view in the A-A' cross-section, sub-section (C) shows a sectional view in the B-B' cross-section, and sub-section (D) shows a sectional view in the C-C' cross-section of the sub-section (A). Sub-section (E) shows a sectional view of a low voltage transistor formed in an area different from the sub-section (A). The cross-section used in the sub-section (E) is named the D-D' cross-section. Although this embodiment describes only one memory unit, the embodiment is applicable to any number of memory units. This embodiment is explained with reference to FIG. 25. The same numerals are given to the portion that achieves the same function as in the sixth embodiment shown in FIG. 15, and detailed explanation of the portion is not repeated.

Points of this embodiment, which are different from the sixth embodiment are that a selection gate 97 is formed by the poly silicon film that is formed simultaneously with the floating gate 65, that a high voltage endurance gate oxide film 96 for the high-voltage transistor is formed by a twice-oxidized film under the selection gate 97, and that the silicon oxide film 68 is formed on the surface of the selection gate 97. The film thickness of the high voltage endurance gate oxide film 96 is between 400A and 600A, and here, in this embodiment, it is 500A. The film thickness of the selection gate 97 is between 2500A and 4500A, and here, it is 3500A. The film thickness of the silicon oxide film 68 is between 150A and 250A, and here, it is 200A. Illustration of the silicon oxide film 68 is omitted in the sub-section of FIG. 25.

FIG. 26 and FIG. 27 show sectional views for explaining the tenth embodiment of the manufacturing method for manufacturing the semiconductor device of the tenth embodiment. FIG. 26 shows sectional views in the A-A' cross-section and the C-C' cross-section of the sub-section (A) of FIG. 25, and in the D-D' cross-section of the sub-section (E) of FIG. 25. Further, FIG. 27 shows sectional views in the B-B' cross-section of the sub-section (A) of FIG. 25. The embodiment of this manufacturing method is explained with reference to FIG. 25 through FIG. 27.

(1) The field oxide film 3 for unit separation is formed on the P substrate 1 by the usual LOCOS method. A sacrifice oxide film is formed on the surface of the active region demarcated by the field oxide film 3, and a channel dope injection is performed. After removing the sacrifice oxide film, a heat oxidization process is performed such that the silicon oxide film whose film thickness is between 350A and 450A is formed in the active region. By the phototype process technology and the etching technology, the silicon oxide film is selectively removed such that the silicon oxide film remains only in the high-voltage transistor region. A heat oxidization process is performed such that the gate oxide film 63 for the memory is formed on the surface of the active region of the memory unit region and the low voltage transistor region. At this time, the silicon oxide film in the high-voltage transistor region grows to have film thickness between 400A and 600A, and turns into the high voltage endurance gate oxide film 96. A poly silicon film in thickness between 2500A and 4500A is deposited all over the upper surface of the P substrate 1. By the phototype process technology and the etching technology, the floating gate 65 is formed on the memory unit region of the field oxide film 3 and the gate oxide film 63 for the memory, and the selection gate 97 is formed on the high-voltage transistor region of the field oxide film 3 and the high voltage endurance gate oxide film 96 (refer to sub-section (a) of FIG. 26 and sub-section (a) of FIG. 27).

(2) The silicon oxide film 68 in film thickness between 150A and 250A is formed on the surface of the selection gate 97 by a heat oxidization process, and the inter-layer silicon oxide film 67 is formed on the surface of the floating gate 65. At this time, the low voltage transistor region of the gate oxide film 63 for the memory of grows, and becomes the silicon oxide film 98 (refer to sub-section (b) of FIG. 26 and sub-section (b) of FIG. 27).

(3) The resist pattern 77 is formed such that the floating gate 65 and the selection gate 97 may be covered, and the low voltage transistor region of the silicon oxide film 98 is selectively removed (refer to subsection (c) of FIG. 26 and subsection (c) of FIG. 27).

(4) After removing the resist pattern 77, the low voltage endurance gate oxide film 71 is formed on the surface of the active region of the low voltage transistor region by a heat oxidization process, then, the poly silicon film 79 is deposited all over the P substrate 1 (refer to sub-section (d) of FIG. 17 and sub-section (d) of FIG. 21).

(5) The control gate 69 and the gate electrode 73 for the low voltage transistor are formed from the poly silicon film 79 by the phototype process technology and the etching technology. Then, the N type diffusion layers 5, 7, and 9 and the N type diffusion layer for the low voltage transistor are formed by the ion implantation (refer to FIG. 25).

In this embodiment, although the inter-layer silicon oxide film 67 serves as an insulation film between the floating gate 65 and the control gate 69, a laminating film consisting of silicon oxide film/silicon nitride film/silicon oxide film may serve the purpose, like the manufacturing method explained with reference to FIG. 19. Further, the capacitor pattern consisting of the lower layer of the poly silicon film formed simultaneously with the floating gate 65, and the upper layer of the poly silicon film formed simultaneously with the control gate 69 may be simultaneously formed, like the manufacturing method explained with reference to FIG. 21.

Although the embodiments of the present invention are described as above, the present invention is not limited to these embodiments, but various variations and modifications may be made without departing from the scope of the present invention.

The semiconductor device of the present invention includes a control gate consisting of a poly silicon film formed on a first insulation film, and a poly silicon film formed on the first insulation film and a gate oxide film. The semiconductor device further includes a non-volatile memory that includes a floating gate provided on either of the upper layer and the lower layer of the control gate through a second insulation film on the first insulation film, the floating gate overlapping with the control gate. The control gate and the floating gate are laminated on the first insulation film, thereby a large coupling ratio is obtained, which enables rewriting at a low voltage. Further, since the control gate is formed on the first insulation film, both a positive voltage and a negative voltage can be applied to the control gate.

The second insulation film between the control gate and the floating gate of the semiconductor device of the present invention is structured by a laminating film of silicon oxide film—silicon nitride film—silicon oxide film, enhancing the reliability of the memory.

The semiconductor device of the present invention includes a tunnel oxide film having film thickness that is thinner than the gate oxide film for the memory on one of two diffusion regions, and a part of the floating gate is formed also on the tunnel oxide film, which enables an electric charge to be injected to and discharged from the floating gate through the tunnel oxide film, thereby the design flexibility of the memory properties is raised.

The manufacturing method of the present invention includes a process (A) wherein the gate oxide film for a transistor is formed on the surface of the active region, a process (B) wherein the control gate is formed on the field oxide film of the memory unit region, and a gate electrode for the transistor is formed on the gate oxide film for the transistor, a process (C) wherein an inter-layer silicon oxide film is formed on the surface of the control gate and on the surface of the gate electrode for the transistor, a process (D) wherein the gate oxide film for the memory is formed on the surface of the active region of the memory unit region, and a process (E) wherein the floating gate is formed on the inter-layer silicon oxide film, the field oxide film and the gate oxide film for the memory, according to which the semiconductor device of the present invention can be manufactured. Further, both the gate oxide film for the transistor and the gate oxide film for the memory can be formed by a once-oxidized film, the reliability of both the gate oxide films is enhanced, and reduction of film thickness variation is achieved.

The present invention also provides the manufacturing method that includes a process (A) wherein the gate oxide film for the memory is formed on the surface of the active region, a process (B) wherein a floating gate is formed on a gate oxide film for the memory in the memory unit region, and the field oxide film, a process (C) wherein the inter-layer silicon oxide film is formed on the surface of the floating gate, while forming a high voltage endurance gate oxide film for the high-voltage transistor by growing film thickness of the gate oxide film for the memory on the surface of the active region in the high-voltage transistor region, a process (D) wherein the low voltage endurance gate oxide film for the low voltage transistor is formed on the surface of the active region of the low voltage transistor region, while growing film thickness of the high voltage endurance gate oxide film, and a process (E) wherein a floating gate is formed at least on the upper layer of the floating gate that is present on the field oxide film in the memory unit region via the inter-layer silicon oxide film, according to which the semiconductor device of the present invention can be manufactured. Further, each of the low voltage endurance gate oxide film for the low voltage transistor and the gate oxide film for the memory can be formed by the once-oxidized film, enhancing the reliability of both the gate oxide films, and reducing film thickness variation.

The present invention further provides the manufacturing method that includes a process (A) wherein silicon oxide film for the gate oxide film is formed on the surface of the active region, a process (B) wherein the gate oxide film for the non-volatile memory is formed on the surface of the active region of the memory unit region, while forming the high voltage endurance gate oxide film for the high voltage transistor by growing film thickness of the silicon oxide film for the gate oxide film in the high voltage transistor region, a process (C) wherein the floating gate is formed on the gate oxide film for the memory in the memory unit region and the field oxide film, and the gate electrode for the high voltage transistor is formed on the high withstand gate oxide film, a process (D) wherein the inter-layer silicon oxide film is formed on the surface of the floating gate and the surface of the gate electrode for the high voltage transistor, a process (E) wherein the low withstand gate oxide film for the low voltage transistor is formed on the surface of the active region of the low transistor region, and a process (F) wherein the control gate is formed through the inter-layer silicon oxide film at least on the upper layer of the floating gate that is present on the field oxide film of the memory unit region, and the gate electrode for the low voltage transistor is formed on the low withstand gate oxide film, according to which the semiconductor device of the present invention is manufactured. Further, each of the low voltage endurance gate oxide film for the low voltage transistor and the gate oxide film for the memory is formed by the once-oxidized film, enhancing the reliability of the both gate oxide films and reducing film thickness variation. Further, the high voltage endurance gate oxide film for the high-voltage transistor is formed by a twice-oxidized film, enhancing the reliability of the high voltage endurance gate oxide film and reducing film thickness variation, as compared with the conventional technology.

The invention claimed is:

1. A manufacturing method of a semiconductor device equipped with a non-volatile memory and a transistor, comprising:
    a step (A) wherein a field oxide film for unit separation is formed on the surface of a semiconductor substrate, and an active region surrounded by the field oxide film is formed, and a gate oxide film for the transistor is formed on the surface of the active region,
    a step (B) wherein a poly silicon film is formed all over the surface of the semiconductor substrate, a control gate is formed on the field oxide film at a memory unit region, and a gate electrode for the transistor is formed on the gate oxide film for the transistor by patterning the poly silicon film,
    a step (C) wherein an inter-layer silicon oxide film is formed on the surface of the control gate and the surface of the gate electrode for the transistor by a heat oxidization process,
    a step (D) wherein a gate oxide film for the non-volatile memory is formed on the surface of an active region of a memory unit region by a heat oxidization process after selectively removing the silicon oxide film on the surface of the active region of the memory unit region, and
    a step (E) wherein a poly silicon film is formed all over the surface of the semiconductor substrate, and a floating gate is formed on the inter-layer silicon oxide film at the memory unit region, the field oxide film, and the gate oxide film for the non-volatile memory by patterning the poly silicon film.

2. A manufacturing method of a semiconductor device equipped with a non-volatile memory, a high-voltage transistor, and a low voltage transistor, comprising:
    a step (A) wherein a field oxide film for unit separation is formed on a semiconductor substrate surface, an active region surrounded by the field oxide film is formed, and a gate oxide film for the non-volatile memory is formed on the surface of the active region,
    a step (B) wherein a poly silicon film is formed all over the surface of the semiconductor substrate, and a floating gate is formed on a memory unit region of the gate oxide film for the non-volatile memory, and on the field oxide film by patterning the poly silicon film,
    a step (C) wherein by a heat oxidation process, an inter-layer silicon oxide film is formed on the surface of the floating gate, and thickness of the gate oxide film for the non-volatile memory on the active region surface of the high-voltage transistor region is grown and a high voltage endurance gate oxide film for the high-voltage transistor is formed,
    a step (D) wherein a low voltage endurance gate oxide film for the low voltage transistor is formed on the surface of the active region of the low voltage transistor region, while growing thickness of the high voltage endurance gate oxide film by a heat oxidization process, after selectively removing the silicon oxide film of the active region surface of the low voltage transistor region, and
    a step (E) wherein a poly silicon film is formed all over the surface of the semiconductor substrate and is patterned, a control gate is formed at least on the inter-layer silicon oxide film on the floating gate that is present in the memory unit region on the field oxide film, and a gate electrode for the low voltage transistor is formed on the low voltage endurance gate oxide film, and a gate electrode for the high-voltage transistor is formed on the high voltage endurance gate oxide film.

3. A manufacturing method of a semiconductor device equipped with a non-volatile memory, a high-voltage transistor, and a low voltage transistor, comprising:
    a step (A) wherein a field oxide film for unit separation is formed on the surface of a semiconductor substrate, an active region surrounded by the field oxide film is formed, and a silicon oxide film for a gate oxide film is formed on the surface of the active region,
    a step (B) wherein a gate oxide film for a non-volatile memory is formed on the surface of the active region of a memory unit region, while forming a high voltage endurance gate oxide film for a high-voltage transistor by growing thickness of the silicon oxide film for the gate oxide film of the high-voltage transistor region by a heat oxidization process after selectively removing at least the silicon oxide film for the gate oxide film on the surface of the active region of the memory unit region,
    a step (C) wherein a poly silicon film is formed all over the surface of the semiconductor substrate, a floating gate is formed on the gate oxide film for the non-volatile memory and on the field oxide film, and a gate electrode for the high-voltage transistor is formed on the high voltage endurance gate oxide film by patterning the poly silicon film,
    a step (D) wherein an inter-layer silicon oxide film is formed on the surface of the floating gate and on the surface of the gate electrode for the high-voltage transistor by a heat oxidization process,
    a step (E) wherein a low voltage endurance gate oxide film for the low voltage transistor is formed on the surface of the active region of a low voltage transistor region by a heat oxidization process after selectively removing the silicon oxide film of the active region surface of the low voltage transistor region, and a step (F) wherein a poly silicon film is formed all over the surface of the semiconductor substrate and patterned, a control gate is formed at least on the inter-layer silicon oxide film on the floating gate that is present in the memory unit region of the field oxide film, and a gate electrode for the low voltage transistor is formed on the low voltage endurance gate oxide film by patterning the poly silicon film.

* * * * *